United States Patent
Nale et al.

(10) Patent No.: US 10,339,072 B2
(45) Date of Patent: Jul. 2, 2019

(54) READ DELIVERY FOR MEMORY SUBSYSTEM WITH NARROW BANDWIDTH REPEATER CHANNEL

(71) Applicant: Intel Corporation, Santa Clara, CA (US)

(72) Inventors: Bill Nale, Livermore, CA (US); Pete D Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/089,455

(22) Filed: Apr. 1, 2016

(65) Prior Publication Data

US 2017/0285941 A1 Oct. 5, 2017

(51) Int. Cl.
*G06F 13/16* (2006.01)
*G06F 3/06* (2006.01)
(Continued)

(52) U.S. Cl.
CPC .......... *G06F 13/16* (2013.01); *G11C 7/10* (2013.01); *G06F 3/061* (2013.01); *G06F 3/0629* (2013.01);
(Continued)

(58) Field of Classification Search
CPC ............ G06F 13/1478; G06F 13/4018; G06F 3/0604; G06F 3/0629; G06F 3/085;
(Continued)

(56) References Cited

U.S. PATENT DOCUMENTS 7,296,129 B2  11/2007  Gower et al.
7,765,368 B2   7/2010  Gower et al.
(Continued)

FOREIGN PATENT DOCUMENTS

WO  2015065310 A1  5/2015

OTHER PUBLICATIONS

International Search Report and Written Opinion for PCT Patent Application No. PCT/US2017/021003, dated Jun. 21, 2017, 16 pages.
International Search Report and Written Opinion for PCT Patent Application No. PCT/US2017/021004, dated Jun. 21, 2017, 18 pages.
International Search Report and Written Opinion for PCT Patent Application No. PCT/US2017/021005, dated Jun. 16, 2017, 16 pages.
Final Office Action for U.S. Appl. No. 15/089,453, dated Oct. 19, 2017, 43 pages.
(Continued)

*Primary Examiner* — Glenn Gossage
(74) *Attorney, Agent, or Firm* — Compass IP Law PC

(57) ABSTRACT

A system with memory includes a repeater architecture where the memory connects to a host with one bandwidth, and a repeater extends a channel with a lower bandwidth. A memory circuit includes a first group of memory devices coupled point-to-point to a host device via a first group of read signal lines. The memory circuit includes a second group of memory devices coupled point-to-point to the first group of memory devices second group of read signal lines to extend the memory channel to the second group of memory devices. The second group of read signal lines has fewer read signal lines than the first group. The memory circuit includes a repeater to share read bandwidth between the first and second groups of memory devices, with up to a portion of the bandwidth for reads to the second group of memory devices, and at least an amount equal to the bandwidth less the portion for reads to the first group of memory devices. The repeater or buffer may accumulate data read from the second group of memory devices or a second memory module and burst the accumulated data to the host device with the first bandwidth.

26 Claims, 16 Drawing Sheets

(51) Int. Cl.
*G06F 13/40* (2006.01)
*G11C 5/06* (2006.01)
*G11C 7/10* (2006.01)
*G11C 5/04* (2006.01)

(52) U.S. Cl.
CPC .......... *G06F 3/0631* (2013.01); *G06F 3/0685* (2013.01); *G06F 13/1678* (2013.01); *G06F 13/4018* (2013.01); *G11C 5/04* (2013.01); *G11C 5/06* (2013.01)

(58) Field of Classification Search
CPC ...... G06F 3/061; G06F 3/0631; G06F 3/0655; G06F 3/067; G06F 13/1678
See application file for complete search history.

(56) References Cited

U.S. PATENT DOCUMENTS

| | | | |
|---|---|---|---|
| 8,166,218 B2 | 4/2012 | Rajamani | |
| 8,880,772 B2 | 11/2014 | Sauber | |
| 8,930,647 B1 | 1/2015 | Smith | |
| 9,232,651 B2 | 1/2016 | Ware et al. | |
| 9,317,427 B2* | 4/2016 | DeSota | G06F 12/0646 |
| 9,495,309 B2 | 11/2016 | Sauber | |
| 2004/0081005 A1* | 4/2004 | Garrett, Jr. | G06F 13/1657 365/200 |
| 2005/0108458 A1* | 5/2005 | Vogt | G06F 13/4256 711/1 |
| 2005/0108490 A1* | 5/2005 | Vogt | G06F 13/4243 711/167 |
| 2005/0210216 A1* | 9/2005 | Jobs | G06F 13/1678 711/170 |
| 2006/0004953 A1* | 1/2006 | Vogt | G06F 13/1657 711/105 |
| 2006/0146637 A1* | 7/2006 | Vogt | G11C 5/04 365/230.03 |
| 2006/0157682 A1* | 7/2006 | Scheuerlein | G11C 13/0004 257/4 |
| 2006/0288132 A1 | 12/2006 | McCall et al. | |
| 2007/0058471 A1* | 3/2007 | Rajan | G11C 5/02 365/222 |
| 2007/0089030 A1* | 4/2007 | Beracoechea | H04L 49/90 714/762 |
| 2008/0005496 A1* | 1/2008 | Dreps | G06F 13/1673 711/154 |
| 2008/0077731 A1 | 3/2008 | Forrest et al. | |
| 2008/0189455 A1 | 8/2008 | Dreps et al. | |
| 2009/0193201 A1 | 7/2009 | Brittain et al. | |
| 2009/0216924 A1* | 8/2009 | Bennett | G06F 13/1684 710/104 |
| 2009/0319719 A1 | 12/2009 | Perego et al. | |
| 2011/0055617 A1 | 3/2011 | Sankuratri et al. | |
| 2011/0138133 A1* | 6/2011 | Shaeffer | G06F 13/1678 711/149 |
| 2012/0191921 A1* | 7/2012 | Shaeffer | G06F 13/1678 711/149 |
| 2012/0210089 A1 | 8/2012 | Larson | |
| 2012/0221769 A1* | 8/2012 | Ware | G06F 13/1694 711/103 |
| 2017/0093400 A1 | 3/2017 | Bains et al. | |
| 2017/0133083 A1 | 5/2017 | Li et al. | |
| 2017/0249265 A1 | 8/2017 | Shaeffer et al. | |

OTHER PUBLICATIONS

Office Action for U.S. Appl. No. 15/089,453, dated May 9, 2017, 34 pages.
Office Action for U.S. Appl. No. 15/089,454, dated Dec. 24, 2017, 49 pages.

* cited by examiner

US 10,339,072 B2

READ DELIVERY FOR MEMORY SUBSYSTEM WITH NARROW BANDWIDTH REPEATER CHANNEL

RELATED APPLICATIONS

The present application is related to U.S. patent application Ser. No. 15/089,453, entitled: "Memory Subsystem with Narrow Bandwidth Repeater Channel," filed concurrently herewith, now abandoned, and U.S. patent application Ser. No. 15/089,454, entitled: "Write Delivery for Memory Subsystem with Narrow Bandwidth Repeater Channel," filed concurrently herewith, now abandoned.

FIELD

The descriptions are generally related to memory channels, and more particular descriptions are related to read data delivery for a memory channel having a narrow bandwidth backend channel from a channel repeater.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, Intel Corporation, All Rights Reserved.

BACKGROUND

With increases in processor capability and performance, the demand for more functionality from electronic devices increases. The increased functionality in turn increases processor bandwidth demand, which is related to higher overall data throughput. Thus, the inability to move data into and out of the processor with higher bandwidths can impede the continuation of processor performance improvements. Modern computing systems include layers of memory, from the fastest, smallest on die memory storage (e.g., cache), to main memory, to larger and slower nonvolatile storage. Higher processor throughput typically requires moving more data into main memory from nonvolatile storage, and then moving that data between main memory and cache layers on the processor.

Traditional connection of the main memory to the processor is via native memory channels. Native memory channels rely on a direct connection from the memory devices to a controller circuit or memory manager/driver on the host processor. Traditional memory connection occurs through multidrop channels, where the signal lines of a memory channel extend to multiple memory devices, from devices mounted physically closest to the processor to the devices mounted physically farthest from the processor. The devices connect in turn and drive and/or terminate the same signal lines.

Multidrop channels limit the number of memory devices that can be connected to a processor, which limits the memory capacity of a system. When more memory devices and memory modules are connected with multidrop connections, the loading on the memory channel can degrade the communication over the bus. Thus, there is a tradeoff between increasing the speed and increasing the capacity in a memory subsystem. The tradeoff represents a potential limitation in the ability of memory bandwidth to continue to scale to processor performance. Current systems are already hitting the data rate limit for a native multidrop memory channel with two memory modules installed. While increasing the number of channels can help with the data rate problem, it is not scalable with processor performance increases. Increasing channel bandwidth may also be impractical because of increasing the number of signal lines, as well as increasing device and connector size to accommodate the additional signal lines.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
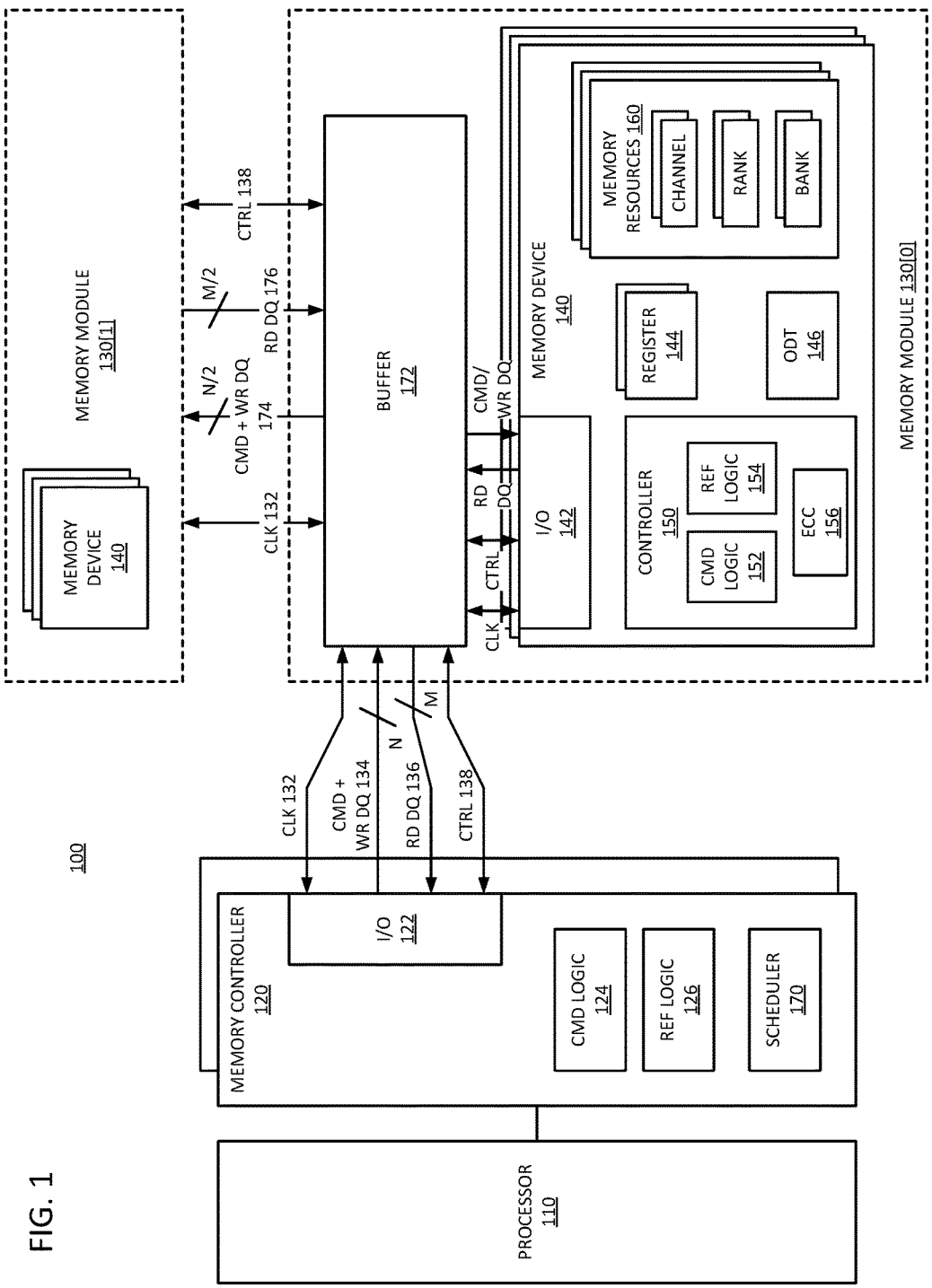
FIG. 1 is a block diagram of an embodiment of a system with a repeater channel architecture having a lower bandwidth repeater channel to extend the memory channel to another memory module.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a system includes a repeater architecture for commands where memory connects to a host with one bandwidth, and repeats the channel with a lower bandwidth. Instead of a multidrop memory channel, such a system can employ a point-to-point memory channel. Whereas a multidrop memory channel has all memory devices or memory modules loading the same signal lines that couple directly to the host, a point-to-point memory channel introduces a buffer that repeats the channel. The buffer can result in the host seeing the loading of only a single connection, while the channel can be extended through the repeating to additional devices.

The memory channel includes unidirectional signal lines instead of bidirectional signal lines. Thus, the memory channel can include a primary command and write data channel from the host to a first memory module, which is extended via a buffer on the first memory module to a second memory module over a narrower bandwidth secondary command and write data channel. The memory channel can further include a primary read channel from the first memory module to the host, which is extended via a buffer on the first memory module to receive read data from a second memory module over a narrower bandwidth secondary read channel.

Reference is made throughout to sharing bandwidth between a first memory module and a second memory module. For purposes of simplicity in description, examples and embodiments are described with respect to a secondary channel having half the bandwidth of the primary channel. Such descriptions will be understood as non-limiting examples. While certain implementations can share half the bandwidth on a repeated channel, other implementations can share other portions of the bandwidth. As one example, the secondary channel could be allocated a third of the bandwidth, such as by alternating packets to/from the secondary memory module where every third memory access packet is allocated to the secondary memory module. It will be understood that other divisions and other portions of the memory channel could be shared in accordance with what is described herein. One of skill in the art will understand how to modify the system to share a portion of the bandwidth other than one half.

Furthermore, reference is made throughout to primary and secondary memory modules coupled to the same memory channel, with bandwidth shared between the memory modules. While connecting two memory modules or DIMMs to the same memory channel provides one example, it will be understood that it is also possible to extend the memory channel to additional memory modules over repeated channels in accordance with what is described herein. Thus, descriptions to a primary memory module can refer to a memory module that couples to a repeated channel, and further repeats the channel to another memory module. In such an implementation, the secondary module can be a secondary module from the perspective of the upstream memory module coupled closer to the host and can be a primary module from the perspective of a downstream memory module coupled farther from the host. The secondary memory module could thus repeat the channel on another repeated channel segment.

In a practical implementation of a system in which there are two memory modules coupled to a memory channel, it may not be practical to repeat any more than half the bandwidth. Thus, the repeated segment or portion may be up to half the native channel. In accordance with an embodiment where more than two memory modules are coupled to the same memory channel, the repeated portion may be more than half the bandwidth. For example, consider an example where each of three connected memory modules is allocated a third of the total bandwidth. The repeater on the first memory module could repeat ⅔ bandwidth on a repeated channel, and the repeater on the second memory module could repeat ⅓ bandwidth on a second repeated channel. The repeater logic may be more complex and the timing may be more complex in such implementations, but it will be understood that such implementation can fall within the scope of what is described herein. Thus, descriptions below with reference to first and second memory modules and a repeated channel with half the bandwidth will be understood as non-limiting examples, and system configurations with more memory modules and/or with different portions of the native memory channel repeated can also be applied to the descriptions herein.

For a write channel, a memory circuit includes a repeater to share the command bandwidth between the first and second memory modules, with up to half the bandwidth for commands to the second memory module, and at least half the bandwidth for commands to the first memory module. A write channel provides a link for access commands from the host to the memory devices, which can include commands to access/manipulate data (e.g., read and/or write commands), and commands to set configuration (e.g., MRS (mode register set) commands). A write channel also provides a link to send data to write to a specified address. Thus, the write channel can provide command, address, and write information. For a read channel, a memory circuit includes a repeater to share the read bandwidth between the first and second memory modules, with up to half the bandwidth for reads from the second memory module, and at least half the bandwidth for reads from the first memory module. A read channel provides a link for the memory devices to return data in response to a read command.

As described herein, a memory circuit includes a first group of signal lines (or a first portion or first segment) to couple point-to-point between a first group of memory devices and a host device. The memory circuit includes a second group of signal lines (or a second portion or second segment) to couple point-to-point between the first group of memory devices (e.g., a first memory module) and a second group of memory devices (e.g., a second memory module). The repeater or buffer architecture can convert a multidrop connection into a point-to-point connection. The point-to-point connection can enable higher data rates, due to the decrease of capacitive loading that would otherwise degrade high-speed communication on the connection.

In one embodiment, a memory subsystem includes point-to-point channels to connect the memory modules to a central processing unit (CPU). A point-to-point channel can scale to much higher data rates than a multidrop channel traditionally used in memory standards. In one embodiment, the memory subsystem supports the connection of two memory modules per channel to a CPU, with a point-to-point channel connected between the CPU and the first module, and a repeater on the first memory module to provide a second point-to-point channel to the second module. In some descriptions, the connection can be described as a first point-to-point channel and a second point-to-point channel, or a primary channel and a secondary channel, or a primary segment and a secondary segment, or some other description. It will be understood that such descriptions are for purposes of illustration and refer to a memory channel that is repeated. Thus, reference to a second channel or a secondary channel can be understood as referring to a second portion of the memory channel or a secondary portion of the memory channel. Thus, a single memory channel can be considered to be separated into a first channel and an extension channel, or to be considered to be treated as separate sub-channels of the memory channel.

The separate read and write portions of the memory channel can be considered a read channel and a write channel, respectively. In one embodiment, the read and write channels are independent with respect to each other. Thus, the implementation of read data processing and repeating can be controlled independently of the implementation of command and write data processing and repeating. As described herein, there are several possible implementations for the read channel, and several possible implementations for the write channel. With the channels independent of each other, there can be any combination of write processing with read processing.

In one embodiment, write processing addresses the delivering of commands and write data to a second DIMM in a memory channel topology where the first DIMM has a full bandwidth unidirectional channel and the second DIMM has a partial bandwidth unidirectional channel. Previous solutions included full bandwidth secondary channels where the commands and write data could simply be passed to the second DIMM without any manipulation. With a narrower repeated channel, the secondary channel is bandwidth limited and takes longer to deliver the commands and write data information. In one embodiment, a buffer (which could also be referred to as a register device) on the first DIMM manipulates the commands and write data before passing the information to the second DIMM.

In one embodiment, command and write data delivery to the secondary memory module includes channel bifurcation with channel passthrough. Bifurcation of the write channel includes treating the write channel as two independent channels, where the memory controller can independently write to the first memory module and the second memory module on separate channels, where each memory module gets a half width command/write data channel. With channel bifurcation, the repeater can simply pass command or write data through a register on the first memory module. With write bifurcation, the memory controller must serialize the command or write data, because the full signal will be transmitted on half the number of signal lines. Thus, bifurcation results in serialization latency, with each packet taking twice as long as a native channel.

In one embodiment, command and write data delivery to the secondary memory module includes selectively sending commands or write data to each memory module. In one embodiment, a command or write data packet includes an identifier (e.g., a bit) to indicate whether it should be sent to the first memory module or the second memory module. In one embodiment, the buffer identifies the correct memory module based on the identifier. In one embodiment, the buffer identifies the correct memory module based on whether the packet is an even packet or an odd packet, with one of the memory modules designated to receive commands and write data in odd numbered packets, and the other to receive commands and write data in even numbered packets. In one embodiment, the first memory module can receive both even and odd packets, and/or can be identified in consecutive packets, allowing temporary use of the full channel bandwidth to the first memory module. The second memory module receives at most half the bandwidth as the data is serialized (either by the host for passthrough, or by the repeater) and takes twice as many UI (unit intervals, or transmission cycles) to send the command or write data. It will be understood that a UI can be a full clock cycle in single data rate systems, or a time between clock edge transitions in a dual data rate system.

In one embodiment, command and write data delivery to the secondary memory module includes speculative passthrough at the repeater. In one embodiment, the host sends an indicator (e.g., a select bit in a first UI of a packet) to indicate which memory module is the target for the command or write data. The repeater sends the first half of every packet to the second memory module with minimum latency. If the select bit indicates the first memory module, the repeater only sends the first half of the packet to the secondary channel, which will complete its serialized transmission in time for the next command or write data to be received. If the select bit indicates the second memory module, the repeater also buffers and transmits the second half of the packet to the secondary channel. In one embodiment, the host includes a rule to guarantee there are never two packets in a row sent to the second memory module.

In one embodiment, read processing addresses the delivering of read data from a second DIMM in a memory channel topology where the first DIMM has a full bandwidth unidirectional read channel and the second DIMM has a partial bandwidth unidirectional read channel. Previous solutions included full bandwidth secondary channels where the read data could simply be delivered from the second DIMM without any manipulation. With a narrower repeated read channel, the secondary channel is bandwidth limited and takes longer to deliver the read data to the first DIMM. In one embodiment, a buffer (which could also be referred to as a register device) on the first DIMM manipulates read data before passing the data to the host.

In one embodiment, read data delivery from the secondary memory module includes channel bifurcation with channel passthrough. Bifurcation of the read channel includes treating the read channel as two independent channels, where the memory controller can independently read from the first memory module and the second memory module on separate channels, where each memory module gets a half width read data channel. With channel bifurcation, the repeater can simply pass read data from the second memory module through a register on the first memory module. With read bifurcation, the read data takes twice as long for the memory controller to receive, because the full signal will be transmitted on half the number of signal lines. Thus, bifurcation results in serialization latency, with each packet taking twice as long as a native channel. In one embodiment, the memory controller can adjust for read latency from the second memory module. In one embodiment, the first memory module buffer adds latency to the read data from the first memory module to match timing of the second memory module.

In one embodiment, read data delivery from the secondary memory module includes data accumulation at the buffer, which can then burst the read data to the host. In one embodiment, the buffer on the first memory module knows when the data from the second memory module will arrive having seen the read command sent earlier, and accumulates the data. In one embodiment, the buffer accumulates half of the read data from the second memory module before bursting the data to the host, and thus, the last bit of data will arrive at the buffer just in time to be sent to the host. In one embodiment, the buffer supports expedited operation for a critical chunk. The critical chunk refers to a chunk of read data that includes the specific data requested by the host. In such a case, in one embodiment, the buffer stores a quarter of the cacheline or wordline and then bursts out the first half of the data, and waits for the rest of the read data to be sent before bursting out the rest of the cacheline/wordline.

In one embodiment, read data delivery from the secondary memory module includes bifurcation of the read channel to the host (e.g., treating the read channel as two separate channels), and the buffer on the first memory module includes logic to allow it to use both half read channels when available. In one embodiment, the buffer knows when the data from the second memory module will arrive, and passes the data directly to the host on one of the half width read channels. When the second memory module does not deliver data, the first memory module can utilize the second half channel to deliver read data, thus delivering full read bandwidth to the host.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (Low Power Double Data Rate (LPDDR) version 4, JESD209-4, originally published by JEDEC in August 2014), WIO2 (Wide I/O 2 (WideIO2), JESD229-2, originally published by JEDEC in August 2014), HBM (High Bandwidth Memory DRAM, JESD235, originally published by JEDEC in October 2013), DDR5 (DDR version 5, currently in discussion by JEDEC), LPDDR5 (currently in discussion by JEDEC), HBM2 (HBM version 2), (currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile device, such as a three dimensional crosspoint (3DXP) memory device, or other byte addressable nonvolatile memory devices, or memory devices that use a chalcogenide phase change material (e.g., chalcogenide glass). In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "DRAM" can apply to any memory device that allows random access, whether volatile or nonvolatile. The memory device or DRAM can refer to the die itself and/or to a packaged memory product.

FIG. 1 is a block diagram of an embodiment of a system with a repeater channel architecture having a lower bandwidth repeater channel to extend the memory channel to another memory module. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single and/or a multicore processing unit. The processing unit can be a primary processor such as a CPU (central processing unit) and/or a peripheral processor such as a GPU (graphics processing unit). System 100 can be implemented as an SOC (system on a chip), or be implemented with standalone components.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAMs in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. As used herein, coupling can refer to an electrical coupling, communicative, and/or a physical coupling. Physical coupling can include direct contact. Electrical coupling includes an interface or interconnection that allows electrical flow and/or signaling between components. Communicative coupling includes connections, including wireless, that enable components to exchange data.

In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a system bus and/or a memory bus, such as a memory channel as referred to above. I/O interface logic 122 (as well as I/O interface logic 142 of memory device 140) can include pins, pads, connectors, signal lines, traces, wires, and/or other hardware to connect the devices. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, termination, and/or other circuitry to send and/or receive signal on the signal lines between the devices. The system bus can be implemented as multiple signal lines coupling memory controller 120 to memory devices 140. The system bus includes at least clock (CLK) 132, command/address (CMD) and write data (WR DQ) 134, read data (RD DQ) 136, and zero or more other signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands and address information) and the signal lines for write and read DQ can be referred to as a "data bus." In one embodiment, independent channels have different clock signals, C/A buses, data buses, and other signal lines. Thus, system 100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

It will be understood that the system bus includes a command and write data bus 134 configured to operate at a bandwidth. In one embodiment, the command and write signal lines (WR DQ 134) can include unidirectional lines for write and command data from the host to memory, and read DQ 136 can include unidirectional lines for read data from the memory to the host. In one embodiment, the data bus can include bidirectional lines for read data and for write/command data. Based on design and/or implementation of system 100, the data bus can have more or less bandwidth per memory device 140. For example, the data bus can support memory devices that have either a ×32 interface, a ×16 interface, a ×8 interface, or other interface. The convention "×W," where W is a binary integer refers to an interface size of memory device 140, which represents a number of signal lines to exchange data with memory controller 120. The interface size of the memory devices is a controlling factor on how many memory devices can be used concurrently per channel in system 100 or coupled in parallel to the same signal lines.

Memory devices 140 represent memory resources for system 100. In one embodiment, each memory device 140 is a separate memory die. In one embodiment, each memory device 140 can interface with multiple (e.g., 2) channels per device or die. Each memory device 140 includes I/O interface logic 142, which has a bandwidth determined by the implementation of the device (e.g., ×16 or ×8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 130. In one embodiment, memory modules 130 represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules 130 can include multiple memory devices 140, and the memory modules can include support for multiple separate channels to the included memory devices disposed on them.

Memory devices 140 each include memory resources 160. Memory resources 160 represent individual arrays of memory locations or storage locations for data. Typically memory resources 160 are managed as rows of data, accessed via wordline (rows) and bitline (individual bits within a row) control. Memory resources 160 can be organized as separate channels, ranks, and banks of memory. Channels are independent control paths to storage locations within memory devices 140. Ranks refer to common locations across multiple memory devices (e.g., same row addresses within different devices). Banks refer to arrays of memory locations within a memory device 140. In one embodiment, banks of memory are divided into sub-banks with at least a portion of shared circuitry (e.g., drivers, signal lines, control logic) for the sub-banks. It will be understood that channels, ranks, banks, and/or other organizations of the memory locations can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140 to operate in different "mode," where command and/or address information or signal lines can trigger different operations within memory device 140 depending on the mode. Settings of register 144 can indicate configuration for I/O settings (e.g., timing, termination or ODT (on-die termination), driver configuration, and/or other I/O settings).

In one embodiment, memory device 140 includes ODT 146 as part of the interface hardware associated with I/O 142. ODT 146 can be configured as mentioned above, and provide settings for impedance to be applied to the interface to specified signal lines. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading. ODT 146 can be applied to specific signal lines of I/O interface 142, 122, and is not necessarily applied to all signal lines.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller. Controller 150 can determine what mode is selected based on register 144, and configure the access and/or execution of operations for memory resources 160 based on the selected mode. Controller 150 generates control signals to control the routing of bits within memory device 140 to provide a proper interface for the selected mode and direct a command to the proper memory locations or addresses.

Referring again to memory controller 120, memory controller 120 includes command (CMD) logic 124, which represents logic or circuitry to generate commands to send to memory devices 140. Typically, the signaling in memory subsystems includes address information within or accompanying the command to indicate or select one or more memory locations where the memory devices should execute the command. In one embodiment, controller 150 of memory device 140 includes command logic 152 to receive and decode command and address information received via I/O 142 from memory controller 120. Based on the received command and address information, controller 150 can control the timing of operations of the logic and circuitry within memory device 140 to execute the commands. Controller 150 is responsible for compliance with standards or specifications within memory device 140, such as timing and signaling requirements. Memory controller 120 can also ensure compliance with standards or specifications by access scheduling and control.

In one embodiment, memory controller 120 includes refresh (REF) logic 126. Refresh logic 126 can be used where memory devices 140 are volatile and need to be refreshed to maintain a deterministic state. In one embodiment, refresh logic 126 indicates a location for refresh, and a type of refresh to perform. Refresh logic 126 can trigger self-refresh within memory device 140, and/or execute external refreshes by sending refresh commands. For example, in one embodiment, system 100 supports all bank refreshes as well as per bank refreshes, or other all bank and per bank commands. All bank commands cause an operation of a selected bank within all memory devices 140 coupled in parallel. Per bank commands cause the operation of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

In one embodiment, system 100 includes multiple memory modules 130 that include memory devices 140. In one embodiment, memory modules 130 provide a repeater architecture for a memory channel. The memory channel can include clock 132, command and write DQ 134, read DQ 136, and zero or more other control signals (CTRL) 138. In a repeater architecture, memory module 130[1] connects to memory controller 120 via buffer or repeater 172 of memory module 130[0]. Thus, memory module 130[0] has a point-to-point connection to memory controller 120, and memory module 130[1] has a point-to-point connection to memory module 130[0]. In the repeater architecture described herein, memory module 130[0] connects to memory controller 120 with a higher bandwidth connection than memory module 130[1]. In one embodiment, buffer 172 provides an input point for all memory channel signals from memory controller 120 to implement the point-to-point connection, and provides clock, command/write, read, and control interfaces to all memory devices 140 of memory module 130[0]. It will be understood that clock 132 and possibly other control signal lines 138 can be repeated via buffer 172. For purposes of illustration, the command and write signal lines as well as the read signal lines on the repeated channel have different reference numbers (174 and 176, respectively) to identify that the repeated channel or repeated channel portion has a lower bandwidth.

For purposes of description, the point-to-point connection from memory module 130[0] to memory controller 120 will be referred to as a primary channel or a primary connection, and the point-to-point connection from memory module 130[1] to memory module 130[0] will be referred to as a secondary channel or a secondary connection. In either case, it will be understood that memory controller 120 can treat a memory channel as having memory module 130[0] and memory module 130[1] connected to it. The timing of signaling to memory module 130[1] may be different than the timing from memory module 130[0].

As illustrated in system 100, memory module 130[0] has a native connection with memory controller 120 with N command and write DQ signal lines, and M read DQ signal lines. In one embodiment, M is greater than N, although in one embodiment M could be equal to N. Memory module 130[1] does not have a native connection with memory controller 120, and in one embodiment connects with N/2 command and write DQ signal lines 174 and M/2 read signal lines 176. It will be understood that buffer 172 includes hardware to interface the primary connection to the secondary connection. In one embodiment, buffer 172 can include software or other logic to control the connection of command and write signal lines 134 to write signal lines 174 and/or of read signal lines 136 to read signal lines 176.

With point-to-point connections, the loading on the memory channel at memory controller 120 is reduced relative to a multidrop architecture. With reduced loading, system 100 can operate the memory channel at a higher data rate than a corresponding multidrop memory channel. In one embodiment, the higher data rate can enable the use of fewer data pins to provide the same throughput. In one embodiment, the signaling timing on the repeated channel is the same as the signaling timing (e.g., the same data rate per signal line) on the primary channel. However, with a lower bandwidth connection or fewer signal lines, the overall data throughput on the repeated channel would be less than the data throughput on the primary channel due to the reduced bandwidth of the channel. The system can compensate for the lower bandwidth by increasing the number of cycles (e.g., unit intervals or UIs) used to transfer the data on the primary channel. For example, data sent on N signal lines over X cycles might be sent over 2× cycles on N/2 signal lines.

Traditional memory systems included only bidirectional data channels, which allowed only a single operation on the data bus. In one embodiment, system 100 includes separate write and read data buses, including unidirectional signal lines. Such unidirectional signal lines can enable a read to be performed with one memory module 130 while a write is performed with the other memory module 130.

In one embodiment, system 100 includes a first group of signal lines to couple point-to-point as a memory channel, such as the signal lines between memory controller 120 or other host device and memory module 130[0]. Memory module 130[0] can be considered a first group of memory devices 140, referring to the memory devices on the memory module. System 100 includes a second group of signal lines to couple point-to-point between memory module 130[0] and memory module 130[1], which can be considered a second group of memory devices 140. Thus, buffer 172 can extend the memory channel to memory module 130[1], but with fewer data lines and a narrow or lower bandwidth. Buffer 172 includes a repeater that can repeat signals from the host on the first group of signal lines to the second group of signal lines, and repeat signals from the memory devices on the second group of signal lines to the host. In general, a buffer enables the point-to-point connection functionality, and provides a single instance of loading on the memory channel for multiple connected memory devices, which can include devices on a repeated channel. A repeater enables the repeating of the memory channel to another memory module and/or group of memory devices.

In one embodiment, the repeated channel from memory module 130[0] to memory module 130[1] includes half as many data signal lines as the primary channel from memory controller 120 to memory module 130[0]. In one embodiment, buffer 172 provides for approximately one half the total bandwidth of the primary channel for use by memory module 130[0], and approximately one half the total bandwidth of the primary channel to be repeated on the secondary channel for use by memory module 130[1]. In one embodiment, depending on the configuration of the primary and secondary channels, buffer 172 can provide more than half the available bandwidth to memory module 130[0], which thus can use more bandwidth than memory module 130[1].

Buffer 172 can separately implement command and write data delivery on repeated write signal lines 174 and read data delivery on repeated read signal lines 176. System 100 can implement any combination of command and write data delivery with read data delivery.

In one embodiment, buffer 172 implements command and write data delivery to the secondary memory module with channel bifurcation and channel passthrough. In one embodiment, buffer 172 implements command and write data delivery to the secondary memory module with selectively sending commands or write data to each memory module, based on either even/odd packet identification or a specific memory module identifier. In one embodiment, buffer 172 implements command and write data delivery to the secondary memory module with speculative passthrough.

In one embodiment, buffer 172 implements read data delivery from the secondary memory module with channel bifurcation and channel passthrough. In one embodiment, buffer 172 implements read data delivery from the secondary memory module with data accumulation at the buffer, which can then burst the read data to the host. In one embodiment, buffer 172 implements read data delivery from the secondary memory module with bifurcation of the read channel to the host (e.g., treating the read channel as two separate channels), and the buffer includes logic to allow the primary memory module to use both half read channels when available.

Figure 2:
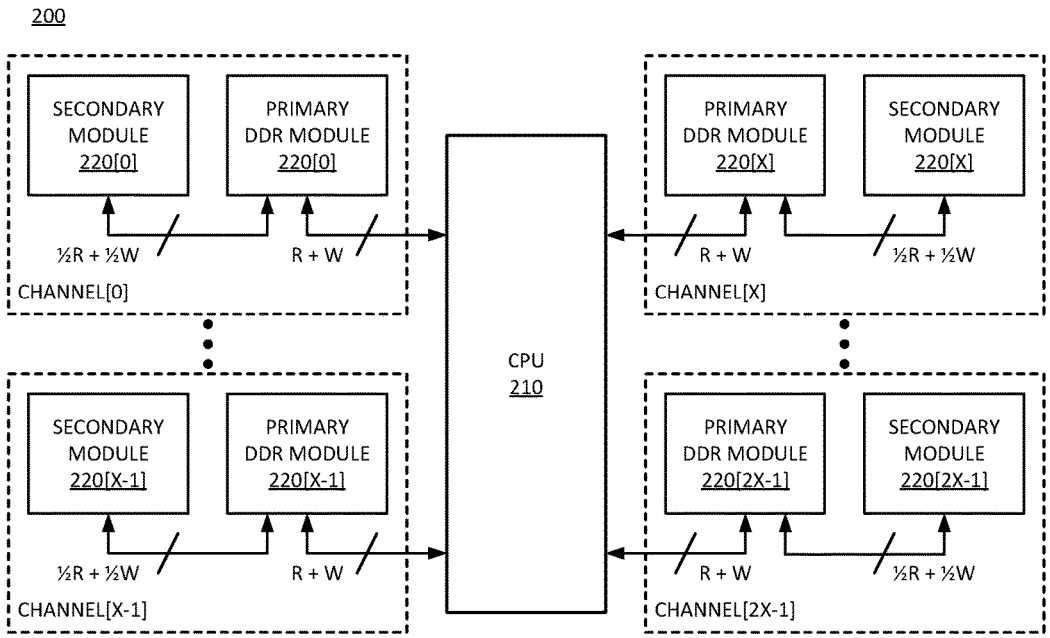
FIG. 2 is a block diagram of an embodiment of a system with a repeater channel architecture in which dual data rate (DDR) modules occupy both primary and secondary positions on the lower bandwidth repeated channel.

FIG. 2 is a block diagram of an embodiment of a system with a repeater channel architecture in which dual data rate (DDR) modules occupy both primary and secondary positions on the lower bandwidth repeated channel. System 200 provides one example of a system in accordance with system 100 of FIG. 1. System 200 includes central processing unit (CPU) 210, which represents a host or host device to which memory resources connect. CPU 210 includes processing resources to perform operations in system 200. CPU 210 also includes a memory controller circuit or equivalent circuitry and logic to drive commands to the memory resources and receive data from the memory resources.

As illustrated, system 200 includes 2× separate channels. In one embodiment, multiple channels connect to the same memory modules, for example in an implementation where a memory module includes memory devices configured to couple to two separate channels. The number of channels in system 200 will be an even number, for example, 2, 4, 6, 8, or some other number of channels. It will be understood that a system can be designed to use an odd number of channels in an alternate embodiment. The placement in the drawing of the channels is merely for illustration, and is not necessarily representative of a practical implementation. In one embodiment, the channels connect memory device groups organized as memory modules, such as DIMMs.

In system 200, each channel includes two memory modules, a primary memory module and a secondary memory module. In one embodiment, all memory modules 220 include the same type of memory devices. For example, in one embodiment, the memory modules all include DDR DRAMs. In one embodiment, the secondary memory modules include a different type of memory from the primary memory modules. Primary DDR module 220[0] couples to CPU 210 with a bandwidth of R for read data and a bandwidth of W for commands and write data. It will be understood that R and W are not necessarily equal, but they could be in one implementation. Secondary module 220[0] couples to primary DDR module 220[0] with a bandwidth of R/2 for read data and a bandwidth of W/2 for commands and write data. Thus, the bandwidth for the secondary connection has half the bandwidth as the primary connection on channel[0]. The remaining channels are similar.

There are known solutions for fully buffered DIMMs that use repeaters on the DIMM. Such solutions implement a full width channel between the first DIMM and the host, as well as a full width channel between the first and second DIMMs. However, in most cases the secondary DIMM does not require a full bandwidth connection, which means the secondary connection is overprovisioned in traditional implementations. System 200 includes a narrow repeated channel. Reducing the repeated channel bandwidth can reduce the number of signal pins required on a package of CPU 210, and on corresponding connectors and PCB trace connections to the secondary DDR module. The reduction of signal pins and signal line traces results in lower silicon costs, lower power, and lower module connector pin counts.

In one embodiment, the X channels include unidirectional command and write data links and unidirectional read data links. In one embodiment, the width of the channel between the primary module and secondary module is half as wide as the channel width between CPU 210 and the primary module. In one embodiment, primary and secondary modules 220 include DIMMs with DRAMs or SDRAMs compliant with a DDR5 standard. In such an implementation, the primary and secondary DIMMs can each deliver approximately half of the CPU channel bandwidth as dictated by an even address distribution between the two modules. The read data link can deliver full read bandwidth from the memory modules to CPU 210. In one embodiment, CPU 210 can read from the primary DIMM simultaneously with writing data to the secondary DIMM. In one embodiment, system 200 can bias bandwidth usage towards the primary DIMM. For example, system 200 can provide up to full bandwidth (all of R and/or all of W) to the primary DIMM, and provide whatever bandwidth is requested for the secondary DIMM.

In one embodiment, primary modules 220 include DDR DRAM memory devices, and second modules 220 include NV (nonvolatile) memory devices. In one embodiment, NV modules 220 include three dimensional memory devices including memory cells with a chalcogenide glass. For example, one implementation of nonvolatile memory devices includes three dimensional crosspoint (3DXP) memory. If DDR modules 220 include DDR5 memory devices and NV modules 220 include 3DXP memory devices, the 3DXP memory operates more efficiently at a narrow bandwidth channel than a traditional native memory channel connection. DDR5 memory devices operate at higher speed than 3DXP memory and at lower power. But 3DXP memory operates at speeds near DDR memory, and is nonvolatile. Thus, one embodiment of system 200 provides both high speed, low power memory with somewhat lower speed, nonvolatile memory on the same memory channel.

In one embodiment, when DDR modules 220 include DDR5 DIMMs and NV modules 220 include 3DXP memory modules, system 200 shares bandwidth between the DDR5 memory and the 3DXP memory (e.g., via a buffer or repeater) on the DDR modules. In one embodiment, the DDR5 DIMM can deliver full channel bandwidth to CPU 230 when there is no 3DXP memory access demand. Due to the bandwidth headroom enabled by the dedicated write and read links, a significant amount of 3DXP memory bandwidth can be delivered to CPU 230 without reducing DDR5 bandwidth.

In one embodiment, the primary DDR modules 220 include a buffer (not specifically shown) that controls read and write portions of the memory channel in accordance with selected or configured delivery mechanisms. In one embodiment, the buffer implements command and write data delivery to the secondary memory module with channel bifurcation and channel passthrough. In one embodiment, the buffer implements command and write data delivery to the secondary memory module with selectively sending commands or write data to each memory module, based on either even/odd packet identification or a specific memory module identifier. In one embodiment, the buffer implements command and write data delivery to the secondary memory module with speculative passthrough.

In one embodiment, the buffer implements read data delivery from the secondary memory module with channel bifurcation and channel passthrough. In one embodiment, the buffer implements read data delivery from the secondary memory module with data accumulation at the buffer, which can then burst the read data to the host. In one embodiment, the buffer implements read data delivery from the secondary memory module with bifurcation of the read channel to the host (e.g., treating the read channel as two separate channels), and the buffer includes logic to allow the primary memory module to use both half read channels when available.

In one embodiment, when system 200 includes two memory modules installed on each CPU memory channel, the memory modules can deliver approximately half of the CPU channel bandwidth as dictated by a balanced address distribution between the two modules. When the first memory module is a DDR DIMM, and the second memory module is a 3DXP DIMM, the various delivery mechanisms can be understood as follows.

In one embodiment, with command and write data bifurcation, each DIMM is limited to half of the total bandwidth. Unused 3DXP module bandwidth cannot be utilized by the DDR DIMM. In one embodiment, with command and write data DIMM selection, in one embodiment, the DDR DIMM can respond to both even and odd commands and therefore deliver full command or write data bandwidth. The 3DXP DIMM would be limited to half bandwidth, and would have an additional latency penalty due to a request only being able to start on either the even or odd packet (depending on the system configuration). In one embodiment, with command and write data speculative passthrough, in one embodiment, the DDR DIMM could respond to both even and odd commands and therefore deliver full bandwidth, while the 3DXP DIMM would be limited to half bandwidth. In one embodiment, the 3DXP DIMM would not have an additional latency penalty, due to being able to start a request on both even and odd packets.

In one embodiment, with read channel bifurcation, each DIMM is limited to half of the total read bandwidth. Unused bandwidth available to the second DIMM (whether DDR or 3DXP) cannot be utilized by the first DDR DIMM. In one embodiment, with read accumulation at the first DIMM, the first DIMM delivers read data at full bandwidth and accumulates and bursts data from the second DIMM. The accumulation can be configured to avoid an additional latency penalty for the second DIMM by causing the end of the data burst from the second DIMM to arrive at the first DIMM just prior to sending it to the host. Thus, the data will arrive at the host with the same delay as read channel bifurcation.

In one embodiment, with read channel bifurcation and opportunistic use at the first DIMM, the first DIMM could utilize both half width read channels when available and therefore deliver full bandwidth, while the second DIMM would be limited to half bandwidth. Such an implementation may not require the buffer to accumulate read data from the second DIMM, but may be more complex to schedule.

Figure 3:
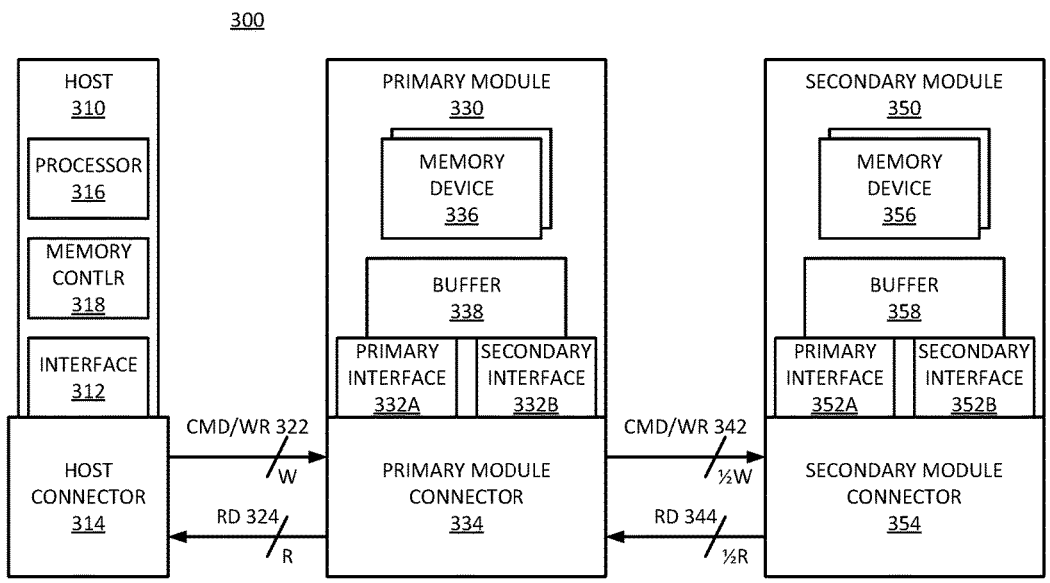
FIG. 3 is a block diagram of an embodiment of a system with a repeater channel architecture in which both primary and secondary memory modules include a buffer.

FIG. 3 is a block diagram of an embodiment of a system with a repeater channel architecture in which both primary and secondary memory modules include a buffer. System 300 provides one example of a system in accordance with system 100, and/or system 200. Host 310 represents logic to control operations in a system in which the memory is included. Host 310 includes processor 316, which can include one or more processing resources that generate requests for access to data stored in memory. Memory controller 318 represents hardware and logic to control access to memory in response to the data needs of processor 316. In one embodiment, memory controller 318 is part of processor 316. Host 310 includes interface 312, which represents hardware such as pins, balls, pads, and/or other hardware to couple host 310 to the memory.

Host connector 314 represents hardware in system 300 to mount host 310 to a PCB or other substrate to interconnect host 310 with the memory resources of primary module 330 and secondary module 350. In one embodiment, host 310 includes discrete components coupled to mounting locations on a PCB. In one embodiment, host 310 is incorporated in an SOC that mounts into a socket, and interface 312 can provide electrical and communicative coupling to the socket connector.

Host connector 314 connects to primary module connector 334 with W command and write signal lines 322 (which can also be referred to as a command/write link) and with R read signal lines 324 (which can also be referred to as a read link). Primary module 330 couples to primary module connector 334. Primary module 330 includes memory devices 336, which can be considered a first group of memory devices. Memory devices 336 represent memory resources to be accessed by requests from host 310. In one embodiment, primary module 330 includes buffer 338, which represents logic to enable a point-to-point connection from primary module connector 334 to host connector 314, and a point-to-point connection from primary module connector 334 to secondary module connector 354. Buffer 338 includes hardware components to provide the interconnections. In one embodiment, buffer 338 includes firmware and/or software logic to provide an interconnection.

In one embodiment, buffer 338 includes primary interface 332A with a bandwidth of W command/write signal lines and R read signal lines for the primary channel connection to host 310. In one embodiment, buffer 338 includes secondary interface 332B with a bandwidth of W/2 command/write signal lines and R/2 read signal lines for the secondary channel connection to secondary module 350. Interface 332B can represent a repeater circuit of buffer 338. It will be understood that in a practical implementation of a memory subsystem, there are limitations on interconnection based on the pin counts of connectors. Thus, it would impractical with traditional systems to repeat the memory channel from primary module 330 to secondary module 350, at least because there would not be a high enough pin count available to support the connection. Thus, buffered DIMMs can repeat the signal within a DIMM, but traditionally memory channels are not repeated as point-to-point connections from one DIMM to another at least because of physical pin count limitations.

As provided in system 300, the repeated channel from primary module 330 to secondary module 350 has fewer signal lines, which can enable a point-to-point connection without having to increase the connection pin count on current industry-standard connectors. Such a repeated channel includes fewer signal lines, which reduces the bandwidth of the channel. However, the reduced bandwidth can be compensated by increasing the signaling speed on the channel.

Thus, host connector 314 connects to secondary module connector 354 via buffer 338 with W/2 command and write signal lines 342 (which can also be referred to as a command/write link) and with R/2 read signal lines 344 (which can also be referred to as a read link). Secondary module 350 includes memory devices 356, which can be considered a second group of memory devices. Memory devices 356 represent memory resources to be accessed by requests from host 310. In one embodiment, secondary module 350 includes buffer 358, which can be the same as or similar to buffer 338. Thus, buffer 358 can include primary interface 352A and secondary interface 352B. In one embodiment, buffer 358 includes a repeater similar to buffer 338, which would enable buffer 358 to support a repeated channel to a next DIMM (not shown).

In one configuration in accordance with system 300, a single DIMM can be manufactured that can be placed in either primary module connector 334 or in secondary module connector 354. The advantage to such an implementation is that the same type of DIMM can be connected in any available DIMM slot. Such a configuration may require the DIMM to be aware of its connection type. In one embodiment, secondary module 350 discovers that it is connected to the memory channel with W/2 signal lines for the command/write link and R/2 signal lines for the read link. In one embodiment, secondary module 350 configures internal routing and connections for use of the reduced bandwidth channel, which can include buffering read data to be sent on more UIs. Based on being connected to the lower bandwidth interface, at least some of primary interface 352A and/or secondary interface 352B will not be used by secondary module 350.

In one embodiment, a practical implementation of system 300 can include a circuit board or circuit that includes host connector 314, primary module connector 334, and secondary module connector 354. The signal lines for connection between host connector 314 and primary module connector 334, and the signal lines for connection between primary module connector 334 and secondary module connector 354 can exist in the circuit even prior to connection of host 310, primary module 330, and/or secondary module 350. Assume for a first configuration (e.g., a 1DPC (one DIMM per channel)) that host 310 and primary module 330 are connected. In such a configuration, in one embodiment, primary module 330 can utilize all bandwidth to host 310. Assume then that a user connects secondary module 350 into system 300. In such a case (e.g., a 2DPC (two DIMM per channel)), in one embodiment, buffer 338 can share the bandwidth between primary module 330 and secondary module 350 to host 310. In one embodiment, in the 2DPC configuration, system 300 can generate a higher throughput to host 310 based on shared utilization of the separate command/write link and read link. For example, host 310 can coordinate a write to one module while reading from the other.

In one embodiment, careful coordination of data addresses between primary module 330 and secondary module 350 can reduce stress on the modules. For example, with proper address location striping, half of the data can be stored on primary module 330 and half of the data on secondary module 350. Greater distribution of the data results in less repeated access to a single module, which can result in lower power consumption per memory module. The lower power consumption can reduce the amount of throttling that might otherwise occur at a memory module. For example, when a threshold amount of traffic (read and/or write traffic) is focused on one module, the components tend to heat up, resulting in lower efficiency. To prevent overheating failures, a controller (not specifically shown) on the memory modules will cause throttling of data access by the host. Spreading data tends to spread the access, which can result in less stress on a single module, and therefore less throttling.

Theoretical predictions suggest peak performance with half of the total bandwidth provided to each memory module. In one embodiment, in system 300, primary module 330 utilizes approximately one half the total memory channel bandwidth, and secondary module 350 utilizes approximately one half the total memory channel bandwidth. It will be understood that the total memory channel bandwidth refers to the memory channel connection at host 310 (e.g., via host connector 314). While the total memory channel bandwidth is provided at primary module 330 at buffer 338, secondary module 350 is only presented with half the total bandwidth.

With the reduced secondary command/write link and read link, system 300 favors lower pin count for higher implementation complexity. The higher complexity comes in management of the data accesses from host 310 to the memory modules. In one embodiment, memory controller 318 manages the data access complexity, for example, by following rules for timing and access frequency to each module. In one embodiment, instead of sharing half the bandwidth for each memory module, system 300 can be configured for primary module 330 to utilize more bandwidth than secondary module 350.

In one embodiment, secondary module 350 does not include secondary interface 352B. Thus, in one embodiment, secondary module 350 does not includes a repeater. Buffer 358 does not necessarily repeat the connection of interface 352A. In one embodiment, secondary module 350 is different than primary module 330 because memory devices 356 are of a different type of memory than memory devices 336. For example, secondary module 350 can be a different type of module with nonvolatile memory devices 356. In one embodiment, secondary module 350 includes the same type of memory, in that memory devices 356 and memory devices 336 are the same type of memory, and secondary module 350 is specifically designed to be mounted in a secondary position.

In one embodiment, buffer 338 controls read and write portions of the memory channel in accordance with selected or configured delivery mechanisms. In one embodiment, buffer 338 implements command and write data delivery to the secondary memory module with channel bifurcation and channel passthrough. In one embodiment, buffer 338 implements command and write data delivery to the secondary memory module with selectively sending commands or write data to each memory module, based on either even/odd packet identification or a specific memory module identifier. In one embodiment, buffer 338 implements command and write data delivery to the secondary memory module with speculative passthrough.

In one embodiment, buffer 338 implements read data delivery from the secondary memory module with channel bifurcation and channel passthrough. In one embodiment, buffer 338 implements read data delivery from the secondary memory module with data accumulation at the buffer, which can then burst the read data to the host. In one embodiment, buffer 338 implements read data delivery from the secondary memory module with bifurcation of the read channel to the host (e.g., treating the read channel as two separate channels), and buffer 338 includes logic to allow the primary memory module to use both half read channels when available.

Figure 4:
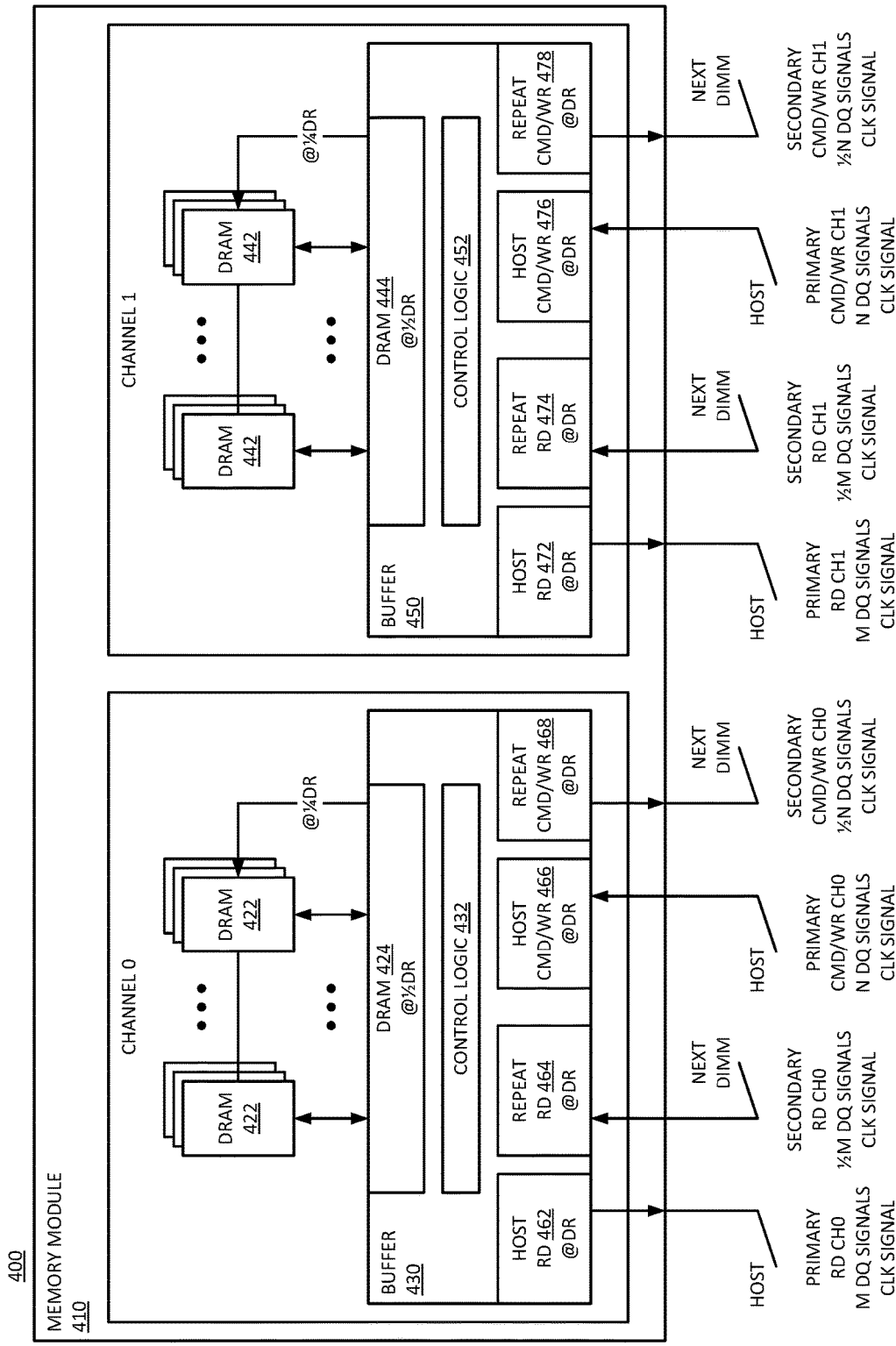
FIG. 4 is a block diagram of an embodiment of a system with a repeater channel architecture illustrating primary and secondary channel connections for first and second channels of a memory module.

FIG. 4 is a block diagram of an embodiment of a system with a repeater channel architecture illustrating primary and secondary channel connections for first and second channels of a memory module. System 400 represents elements of a memory subsystem in accordance with embodiments described herein. System 400 includes memory module 410, which represents a memory module that repeats a memory channel with reduced bandwidth, in accordance with any embodiment described herein, such as a memory module of system 100, a DDR module of system 200, or a primary module of system 300.

In one embodiment, memory module 410 includes two channels, channel 0 and channel 1. Channel 0 includes DRAMs 422 and channel 1 includes DRAMs 442, which can be understood to be independent memory channels. DRAMs 422 and 442 represent memory device resources in memory module 410. The number of memory devices will be understood to vary based on the desired implementation for total capacity and density. The memory devices can be split evenly among the two channels, although such a configuration is not necessary. In one embodiment, the separate channels include separate buffers, buffer 430 for channel 0 and buffer 450 for channel 1. In one embodiment, the same buffer can service a narrow bandwidth repeated channel connection for both channels.

In one embodiment, channel 0 includes buffer 430, which can be a buffer or repeater in accordance with any embodiment described herein. Buffer 430 enables memory module 410 to repeat channel 0 from memory module 410 to a second memory module (not specifically shown) with a lower bandwidth connection. In one embodiment, channel 1 includes buffer 450, which can be a buffer and/or repeater in accordance with any embodiment described herein. Buffer 450 enables memory module 410 to repeat channel 1 from memory module 410 to a second memory module (not specifically shown) with a lower bandwidth connection, which can be the same or a different second memory module connected by repeated channel 0.

In one embodiment, buffer 430 includes control logic 432 to control the flow of data between the host, memory module 410, and a "next DIMM" or additional memory module connected to the repeated channel connection. In one embodiment, buffer 430 includes host read interface 462 to send read data to the host over the primary read channel for channel 0 (CH0). In one embodiment, the primary read channel for channel 0 has M data (DQ) signals and a clock signal, and operates at a data rate of DR. In one embodiment, buffer 430 includes repeat read interface 464 to receive read data from a secondary module over the secondary read channel for channel 0. In one embodiment, the secondary read channel for channel 0 has M/2 data signals and a clock signal, and operates at a data rate of DR.

In one embodiment, buffer 430 includes host command/write (CMD/WR) interface 466 to receive commands and write data from the host over the primary command/write channel for channel 0 (CH0). In one embodiment, the primary command/write channel for channel 0 has N data signals and a clock signal, and operates at a data rate of DR. In one embodiment, buffer 430 includes repeat command/write interface 468 to send commands and write data to a secondary module over the secondary command/write channel for channel 0. In one embodiment, the secondary command/write channel for channel 0 has N/2 data signals and a clock signal, and operates at a data rate of DR.

In one embodiment, buffer 450 is similar to or the same as buffer 430. In one embodiment, buffer 450 includes control logic 452 to control the flow of data between the host, memory module 410, and a "next DIMM" or additional memory module connected to the repeated channel connection. In one embodiment, buffer 450 includes host read interface 472 to send read data to the host over the primary read channel for channel 1 (CH1). In one embodiment, the primary read channel for channel 1 has M data (DQ) signals and a clock signal, and operates at a data rate of DR. In one embodiment, buffer 450 includes repeat read interface 474 to receive read data from a secondary module over the secondary read channel for channel 1. In one embodiment, the secondary read channel for channel 1 has M/2 data signals and a clock signal, and operates at a data rate of DR.

In one embodiment, buffer 450 includes host command/write (CMD/WR) interface 476 to receive commands and write data from the host over the primary command/write channel for channel 1 (CH1). In one embodiment, the primary command/write channel for channel 1 has N data signals and a clock signal, and operates at a data rate of DR. In one embodiment, buffer 450 includes repeat command/write interface 478 to send commands and write data to a secondary module over the secondary command/write channel for channel 1. In one embodiment, the secondary command/write channel for channel 1 has N/2 data signals and a clock signal, and operates at a data rate of DR.

In one embodiment, system 400 applies different data rates (DR) to different aspects of exchanging data with memory module 410. For example, external interfaces 462, 464, 466, 468, 472, 474, 476, and 478 are illustrated as operating at a data rate of DR. DRAMs 422 couple to buffer 430 at DRAM interface 424 at a data rate of ½ DR. In one embodiment, the individual DRAMs 422 operate at a data rate of ¼ DR. Similarly, DRAMs 442 couple to buffer 450 at DRAM interface 444 at a data rate of ½ DR. In one embodiment, the individual DRAMs 442 operate at a data rate of ¼ DR.

While not necessarily illustrated, in one embodiment, the primary and secondary channel connections include differential signaling. Thus, one embodiment of memory module 410 supports differential signaling within the memory subsystem. In one embodiment, system 400 multiplexes DRAM data onto narrow high speed differential links to the host. It will be understood that differential signaling within the memory subsystem can enable further data rate increases due to the improved signal quality of differential signaling. The improvements in signal quality would be beneficial to memory access operations, but differential signaling traditionally would require too many signal lines to fit within a DIMM slot connector. However, as described herein with a point-to-point differential data link and a repeated channel having lower bandwidth, a differential implementation can be implemented with existing memory module connector pin counts. In one embodiment, both the primary channel and the repeated or secondary channel are differential. In one embodiment, the read channels and the write channels are differential. Differential channels can include differential data (DQ) signal pairs and a clock (CLK) signal pair.

In one embodiment, the outward facing interfaces of buffers 430 and 450 include differential signal pairs for data. Outward facing interfaces refer to interfaces with devices external to memory module 410. Thus, connections to the host and to the next DIMM are outward facing interfaces. In one embodiment, the inward facing interfaces of buffers 430 and 450 to the DRAMs are single-ended instead of differential. Thus, for example, DRAM interface 424 includes only single-ended signal lines instead of differential signal lines to couple to DRAMs 422.

In one embodiment, buffers 430 and 450 control read and write portions of the memory channel in accordance with selected or configured delivery mechanisms. In one embodiment, buffers 430 and 450 implement command and write data delivery to the next DIMM with channel bifurcation and channel passthrough. In one embodiment, buffers 430 and 450 implement command and write data delivery to the next DIMM with selectively sending commands or write data to memory module 410 and the next DIMM, based on either even/odd packet identification or a specific memory module identifier. In one embodiment, buffers 430 and 450 implement command and write data delivery to the next DIMM with speculative passthrough.

In one embodiment, buffers 430 and 450 implement read data delivery from the next DIMM with channel bifurcation and channel passthrough. In one embodiment, buffers 430 and 450 implement read data delivery from the next DIMM with data accumulation at the buffer, which can then burst the read data to the host. In one embodiment, buffers 430 and 450 implement read data delivery from the next DIMM with bifurcation of the read channel to the host (e.g., treating the read channel as two separate channels), and buffers 430 and 450 include logic to allow memory module 410 to use both half read channels when available.

Figure 5:
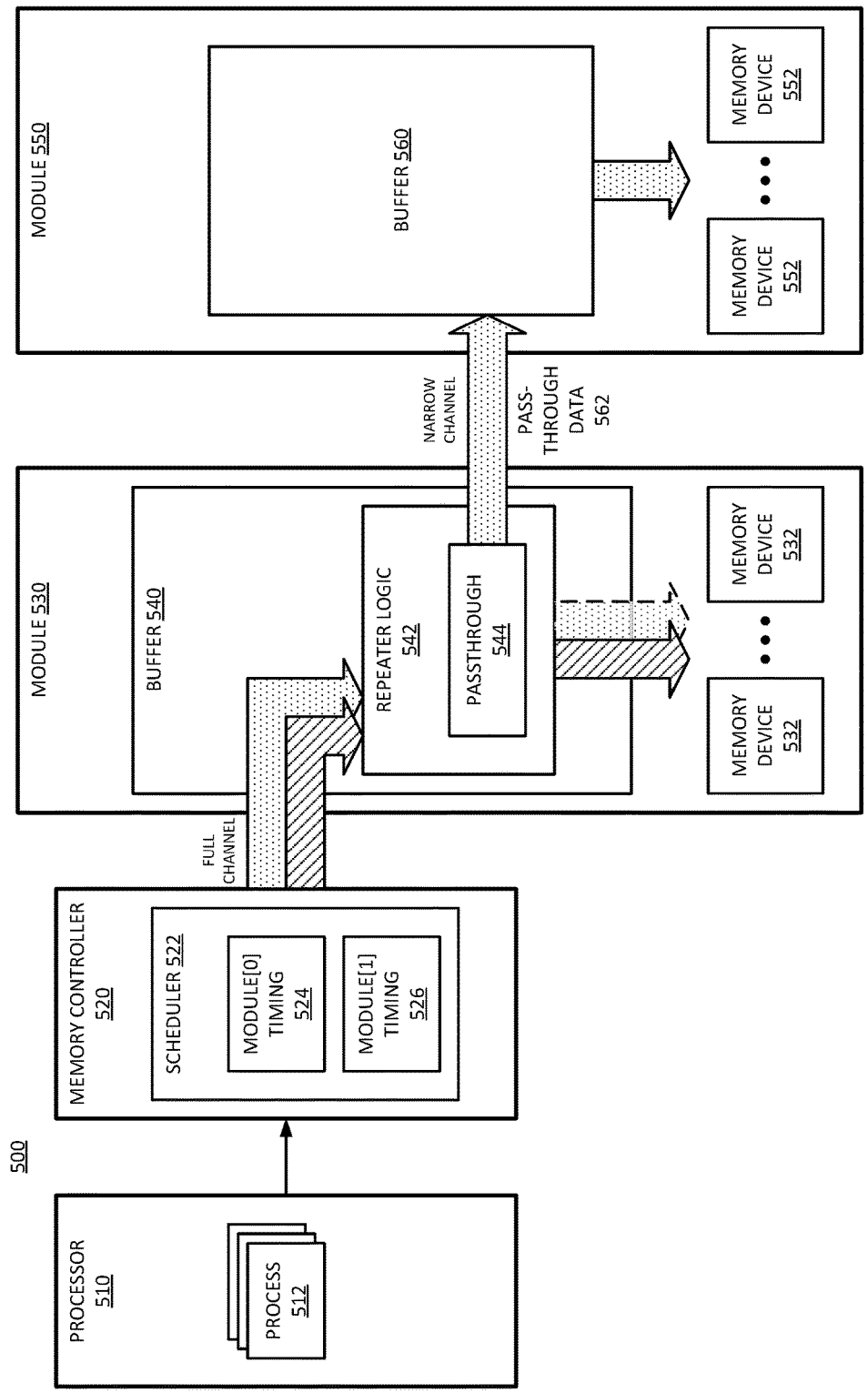
FIG. 5 is a block diagram of an embodiment of a system with a repeater channel architecture that implements write channel repeater passthrough.

FIG. 5 is a block diagram of an embodiment of a system with a repeater channel architecture that implements write channel repeater passthrough. System 500 represents elements of a memory subsystem in accordance with embodiments described herein. System 500 includes memory module 530, which represents a memory module that repeats a memory channel with reduced bandwidth, in accordance with an embodiment described herein, such as a memory module of system 100, a DDR module of system 200, or a primary module of system 300. System 500 includes memory module 550 coupled to the reduced bandwidth repeated channel.

System 500 includes processor 510, which includes hardware resources to execute processes 512. Processor 510 can include one or more processing devices, which can include multicore processors. Processes 512 represent agents, threads, routines, software programs, or other software executed on processor 510. Processes 512 generate requests for data stored in memory, to read and/or to write the data.

System 500 includes memory controller 520, which can be a standalone component or integrated as a controller circuit of processor 510. Memory controller 520 controls access to memory in response to the requests for data from processes 512. Memory controller 520 includes scheduler 522, which enables memory controller 520 to schedule the timing of requests to memory. In one embodiment, scheduler 522 includes module[0] timing 524 to manage the timing of read and/or write operations with module 530. In one embodiment, scheduler 522 includes module[1] timing 526 to manage the timing of read and/or write operations with module 550. It will be understood that the timing of transactions with module 550 will have an inherent delay built in, due to the narrow repeated channel. In one embodiment, scheduler 522 schedules read and/or write operations between modules 530 and 550 based on timing parameters inherent in the system architecture, as well as based on timing characteristics resulting from the specific combination of read and write delivery techniques applied by buffer 540 for repeating the write channel.

System 500 includes at least two groups of memory devices, as represented by memory devices 532 of primary module 530 and memory devices 552 of secondary module 550. Scheduler 522 manages the ordering of commands to memory devices 532 and 552. Management of the ordering of the commands enables memory controller 520 to schedule access between the two separate groups of memory devices. While illustrated as separate groups of memory devices, in one embodiment, similar techniques could be used to separately access two memory devices with point-to-point connections.

In one embodiment, module 530 includes buffer 540, which represents a buffer and/or repeater in accordance with an embodiment of write channel bifurcation. Buffer 540 receives commands and write data from memory controller

520. The connection from memory controller 520 to module 530 is labeled as a "full channel" link, and is illustrated as including two halves. The connection from module 530 to module 550 is labeled as a "narrow channel" link, and includes only one of the halves. In one embodiment, the full channel is a full bandwidth unidirectional channel, and the narrow channel is a partial bandwidth unidirectional channel. Thus, the architecture of system 500 is in contrast to previous solutions that had full bandwidth secondary channels where the commands and write data could simply be passed through without manipulation, and without serializing.

In one embodiment, buffer 540 includes repeater logic 542, which represents logic to enable buffer 540 to repeat selected commands and write data over the narrow repeated channel to module 550. Repeater logic 542 enables buffer 540 to perform write channel bifurcation. Buffer 540 simply passes the command and write data through, but the data is serialized by memory controller 520, which can treat the two write channel portions as independent channels, one to module 530 and one to module 550. Module 550 receives the write data at buffer 560 for memory devices 552.

In one embodiment, repeater logic 542 includes passthrough logic 544, which includes hardware logic to pass through command or write data. Passthrough logic 544 can be or include a register or buffer or latch that can receive the data and send it back out. It will be understood that memory controller 520 will serialize the command or write data in system 500, to allow twice as many write cycles or UIs (unit intervals) for transmission of the data. Passthrough data 562 represents half of the data of the full bandwidth channel passed through to module 550 without manipulation by buffer 540.

Consider a case where module 530 is plugged into system 500 and a connector to receive module 550 is open. In one embodiment in such a case, module 530 utilizes full write bandwidth, and the arrows representing both halves of the write channel can be routed to memory devices 532. If module 550 is then plugged into system 500, in one embodiment, repeater logic 542 allocates half the bandwidth to module 530 and half to module 550. Such bandwidth can be dedicated to each module, without sharing between the modules.

Figure 6:
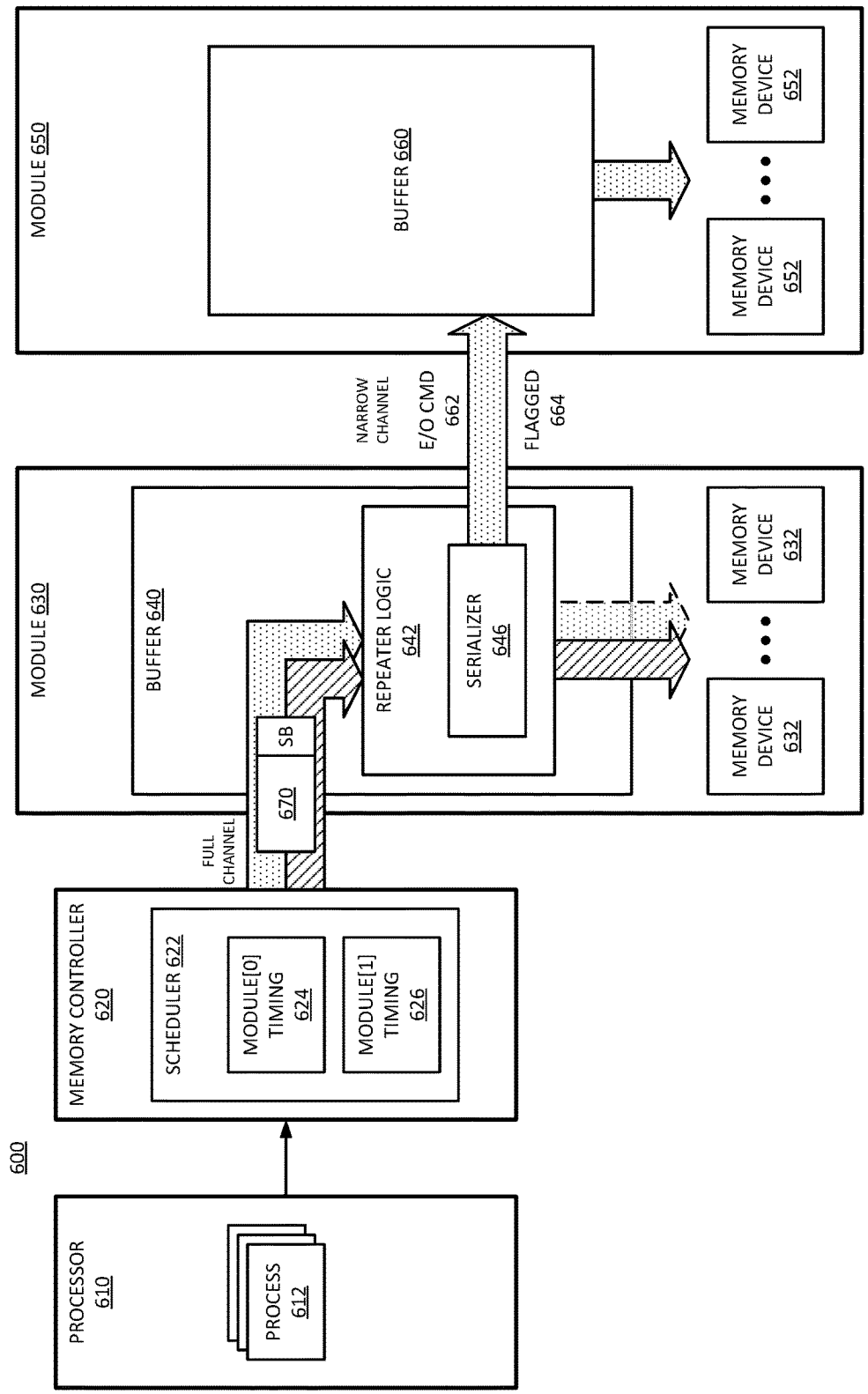
FIG. 6 is a block diagram of an embodiment of a system with a repeater channel architecture that implements write channel repeater memory module selection.

FIG. 6 is a block diagram of an embodiment of a system with a repeater channel architecture that implements write channel repeater memory module selection. System 600 represents elements of a memory subsystem in accordance with embodiments described herein. System 600 includes memory module 630, which represents a memory module that repeats a memory channel with reduced bandwidth, in accordance with an embodiment described herein, such as a memory module of system 100, a DDR module of system 200, or a primary module of system 300. System 600 includes memory module 650 coupled to the reduced bandwidth repeated channel.

System 600 includes processor 610, which includes hardware resources to execute processes 612. Processor 610 can include one or more processing devices, which can include multicore processors. Processes 612 represent agents, threads, routines, software programs, or other software executed on processor 610. Processes 612 generate requests for data stored in memory, to read and/or to write the data.

System 600 includes memory controller 620, which can be a standalone component or integrated as a controller circuit of processor 610. Memory controller 620 controls access to memory in response to the requests for data from processes 612. Memory controller 620 includes scheduler 622, which enables memory controller 620 to schedule the timing of requests to memory. In one embodiment, scheduler 622 includes module[0] timing 624 to manage the timing of read and/or write operations with module 630. In one embodiment, scheduler 622 includes module[1] timing 626 to manage the timing of read and/or write operations with module 650. It will be understood that the timing of transactions with module 650 will have an inherent delay built in, due to the narrow repeated channel. In one embodiment, scheduler 622 schedules read and/or write operations between modules 630 and 650 based on timing parameters inherent in the system architecture, as well as based on timing characteristics resulting from the specific combination of read and write delivery techniques applied by buffer 640 for repeating the write channel.

System 600 includes at least two groups of memory devices, as represented by memory devices 632 of primary module 630 and memory devices 652 of secondary module 650. Scheduler 622 manages the ordering of commands to memory devices 632 and 652. Management of the ordering of the commands enables memory controller 620 to schedule access between the two separate groups of memory devices. While illustrated as separate groups of memory devices, in one embodiment, similar techniques could be used to separately access two memory devices with point-to-point connections.

In one embodiment, module 630 includes buffer 640, which represents a buffer and/or repeater in accordance with an embodiment of write channel module selection. Buffer 640 receives commands and write data from memory controller 620. The connection from memory controller 620 to module 630 is labeled as a "full channel" link, and is illustrated as including two halves. The connection from module 630 to module 650 is labeled as a "narrow channel" link, and includes only one of the halves. In one embodiment, the full channel is a full bandwidth unidirectional channel, and the narrow channel is a partial bandwidth unidirectional channel. Thus, the architecture of system 600 is in contrast to previous solutions that had full bandwidth secondary channels where the commands and write data could simply be passed through without manipulation, and without serializing.

While the two halves are illustrated as being "side by side," it will be understood that such a representation is merely for purposes of illustration to convey that up to half of the data is transmitted to module 650, and at least half of the data is transmitted to module 630. Module 650 receives the write data at buffer 660 for memory devices 652. In one embodiment, buffer 640 includes repeater logic 642, which represents logic to enable buffer 640 to repeat selected commands and write data over the narrow repeated channel to module 650. Repeater logic 642 enables buffer 640 to perform write channel module selection.

In one embodiment, system 600 supports module selection by transmitting only selected packets to module 650. For example, memory controller 620 can include an identifier 'SB' (for select bit) with each write packet 670 sent to buffer 640. The select bit can identify either module 630 or module 650 as the target for packet 670. While described as a select bit, it will be understood that a select field, or a series of bits could be used. In one embodiment, repeater logic 642 repeats flagged commands 664 over the narrow repeated channel. In one embodiment, repeater logic 642 includes serializer 646, which represents logic to send the command or write data over fewer write signal lines with more write cycles.

Alternatively, repeater logic 642 can identify each packet 670 as an 'even' or 'odd' packet, referring to a number of packets counted, such as by a counter (not specifically shown). In one embodiment, system 600 utilizes both even and odd designations as well as a module identifier. In one embodiment, repeater logic 642 routes odd packets to module 630 and even packets to module 650. In one embodiment, repeater logic 642 routes even packets to module 630 and odd packets to module 650. Thus, repeater logic 642 can provide access to only alternating write operations or write packets to module 650. In one embodiment, repeater logic 642 repeats even/odd (E/O) commands 662 over the narrow repeated channel.

In one embodiment, repeater logic 642 can send both even and odd packets to module 630. For example, in one embodiment, if module 650 does not have any write traffic, repeater logic 642 can be configured to provide access to both even and odd packets 670 to module 630. In one embodiment, repeater logic 642 can be configured to pass all odd packets 670 to module 630, and additionally pass any other even packets 670 to module 630 when identified by another identifier. Otherwise, repeater logic 642 may only pass even packets 670 to module 650.

In one embodiment, when packets are designated for a target module, repeater logic 642 forwards specified packets to module 650, and module 650 can determine whether or not module 650 is the target module for the packet. For example, consider an example where repeater logic 642 forwards even packets to module 650. In one embodiment, repeater 642 can be configured to forward all even packets to module 650, even if system 600 additionally identifies a target module with a select bit. In the example where repeater logic 642 forwards all even packets to module 650, in one embodiment, repeater logic 642 also routes the even packets to module 630. Thus, module 630 can receive all odd packets and all even packets, while module 650 receives all even packets. Module 630 and module 650 can inspect the module select bit for all even packets to determine the target module (either module 630 or module 650). The target module can respond to the command/write data, while the non-target or non-selected module can ignore the packet.

Figure 7:
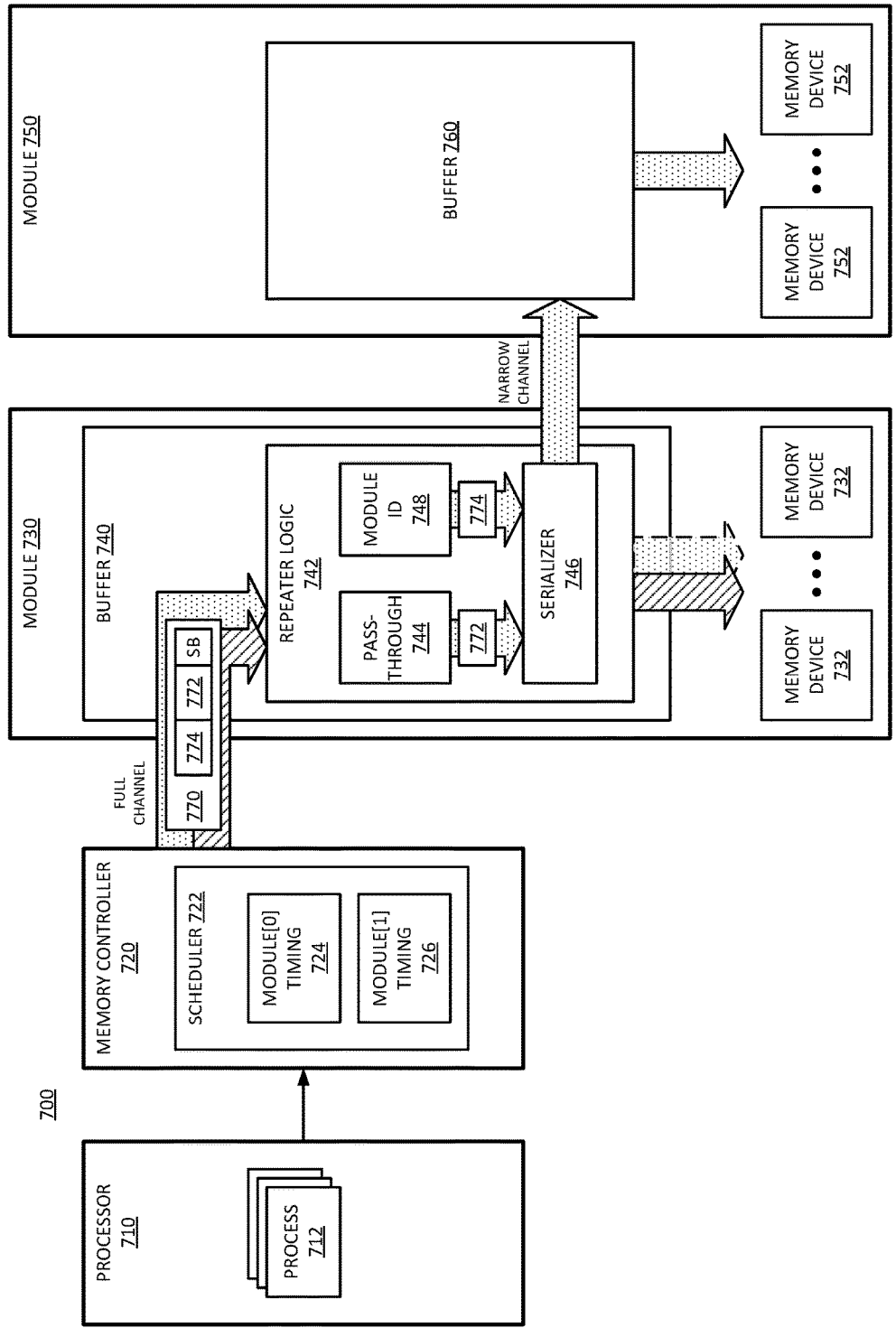
FIG. 7 is a block diagram of an embodiment of a system with a repeater channel architecture that implements write channel speculative passthrough.

FIG. 7 is a block diagram of an embodiment of a system with a repeater channel architecture that implements write channel speculative passthrough. System 700 represents elements of a memory subsystem in accordance with embodiments described herein. System 700 includes memory module 730, which represents a memory module that repeats a memory channel with reduced bandwidth, in accordance with an embodiment described herein, such as a memory module of system 100, a DDR module of system 200, or a primary module of system 300. System 700 includes memory module 750 coupled to the reduced bandwidth repeated channel.

System 700 includes processor 710, which includes hardware resources to execute processes 712. Processor 710 can include one or more processing devices, which can include multicore processors. Processes 712 represent agents, threads, routines, software programs, or other software executed on processor 710. Processes 712 generate requests for data stored in memory, to read and/or to write the data.

System 700 includes memory controller 720, which can be a standalone component or integrated as a controller circuit of processor 710. Memory controller 720 controls access to memory in response to the requests for data from processes 712. Memory controller 720 includes scheduler 722, which enables memory controller 720 to schedule the timing of requests to memory. In one embodiment, scheduler 722 includes module[0] timing 724 to manage the timing of read and/or write operations with module 730. In one embodiment, scheduler 722 includes module[1] timing 726 to manage the timing of read and/or write operations with module 750. It will be understood that the timing of transactions with module 750 will have an inherent delay built in, due to the narrow repeated channel. In one embodiment, scheduler 722 schedules read and/or write operations between modules 730 and 750 based on timing parameters inherent in the system architecture, as well as based on timing characteristics resulting from the specific combination of read and write delivery techniques applied by buffer 740 for repeating the write channel.

System 700 includes at least two groups of memory devices, as represented by memory devices 732 of primary module 730 and memory devices 752 of secondary module 750. Scheduler 722 manages the ordering of commands to memory devices 732 and 752. Management of the ordering of the commands enables memory controller 720 to schedule access between the two separate groups of memory devices. While illustrated as separate groups of memory devices, in one embodiment, similar techniques could be used to separately access two memory devices with point-to-point connections.

In one embodiment, module 730 includes buffer 740, which represents a buffer and/or repeater in accordance with an embodiment of speculative write repeating. Buffer 740 receives commands and write data from memory controller 720. The connection from memory controller 720 to module 730 is labeled as a "full channel" link, and is illustrated as including two halves. The connection from module 730 to module 750 is labeled as a "narrow channel" link, and includes only one of the halves. In one embodiment, the full channel is a full bandwidth unidirectional channel, and the narrow channel is a partial bandwidth unidirectional channel. Thus, the architecture of system 700 is in contrast to previous solutions that had full bandwidth secondary channels where the commands and write data could simply be passed through without manipulation, and without serializing.

While the two halves are illustrated as being "side by side," it will be understood that such a representation is merely for purposes of illustration to convey that up to half of the data is transmitted to module 750, and at least half of the data is transmitted to module 730. Module 750 receives the write data at buffer 760 for memory devices 752. In one embodiment, buffer 740 includes repeater logic 742, which represents logic to enable buffer 740 to repeat selected commands and write data over the narrow repeated channel to module 750. Repeater logic 742 enables buffer 740 to perform speculative write repeating.

In one embodiment, system 700 supports module selection based on an identifier 'SB' (for select bit) with each write packet 770 sent to buffer 740. The select bit can identify either module 730 or module 750 as the target for packet 770. In one embodiment, repeater logic 742 includes passthrough logic 744, to pass through the first half 772 of packet 770, without manipulation or processing of the portion of the packet in buffer 740. Thus, passthrough 744 can be the same as or similar to passthrough 544 of system 500.

In addition to passthrough 744, repeater logic 742 includes module ID logic 748. While passthrough logic 744 passes first half 772 of packet 770 straight through to module 750, in one embodiment, module ID logic 748 determines from the select bit if packet 770 is directed to module 730 or module 750. If the packet is intended for module 730, repeater logic 742 does not send second half packet 774 to module 750. In one embodiment, if the packet is intended for module 750, repeater logic 742 forwards second half 774 to module 750.

In one embodiment, repeater logic 742 includes serializer 746, which represents logic to send the command or write data over fewer write signal lines with more write cycles. In one embodiment, serializer 746 serializes first half 772 on a speculative basis, and serializes second half 774 upon determining that packet 770 should be sent to module 750. In one embodiment, with the speculative transmission of commands and write data, memory controller 720, such as in schedule 722, includes a rule not to send consecutive commands to module 750 without allowing for sufficient delay for repeater logic 742 to transmit a complete command to module 750 via serializer 746. Without such a rule, repeater logic 742 could overrun the narrow channel.

In one embodiment, repeater logic 742 can send both halves of the write channel to memory devices 732, such as when module 750 does not have any write traffic. Thus, while memory controller 720 may prevent consecutive packets 770 to module 750, in one embodiment, memory controller 720 can send any number of consecutive commands to module 730, and send to module 750 only as there is traffic for module 750. Thus, module 730 has access to at least half the bandwidth, and module 750 has access to up to half the bandwidth.

Figure 8:
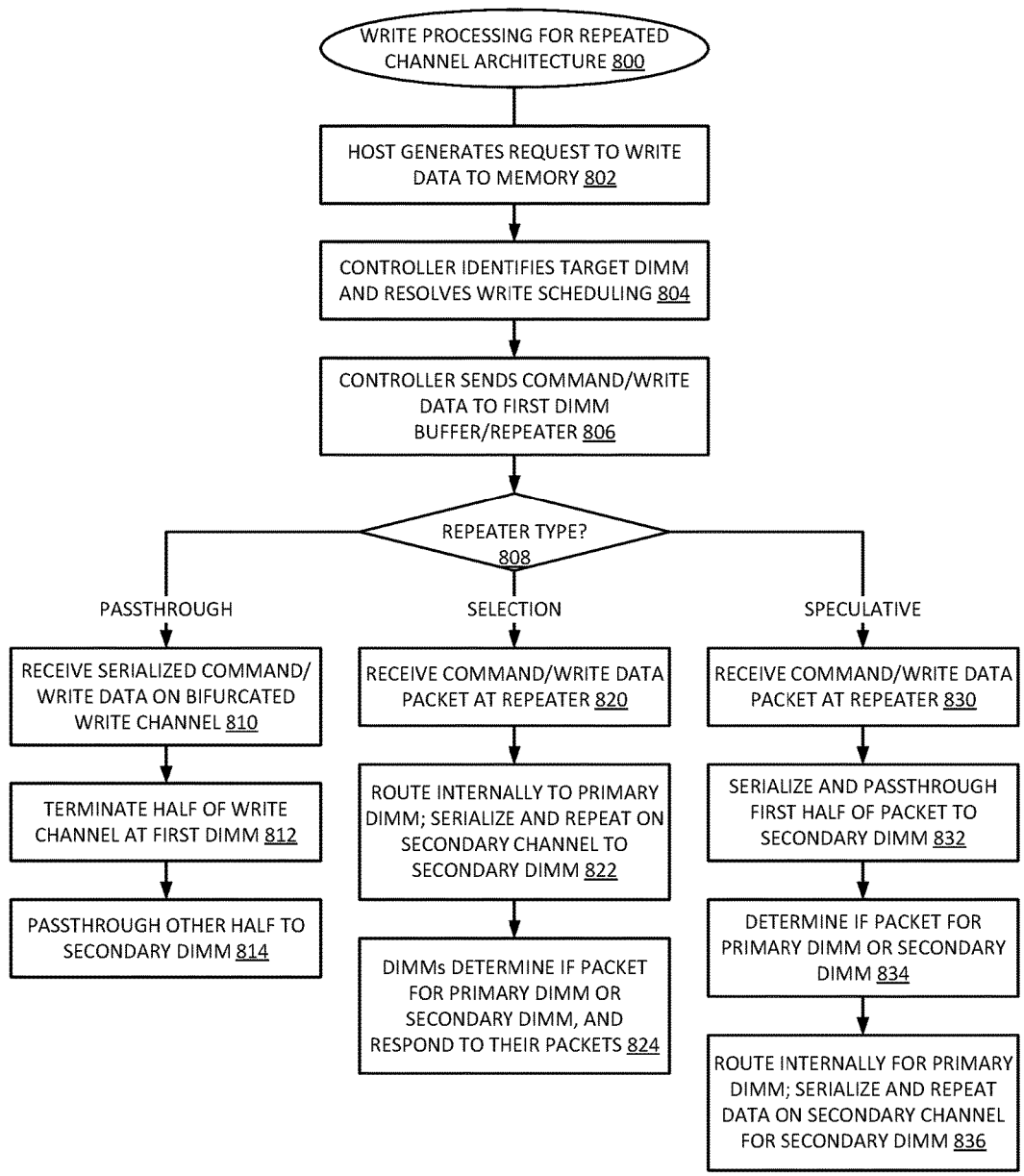
FIG. 8 is a flow diagram of an embodiment of a process for write processing in a repeated channel architecture with primary channel and secondary channel segments having different bandwidths.

FIG. 8 is a flow diagram of an embodiment of a process for write processing in a repeated channel architecture with primary channel and secondary channel segments having different bandwidths. Process 800 illustrates a flow for write processing in a repeated channel architecture. Process 800 provides one example of a flow in accordance with any embodiment of sending commands or write data to a secondary memory module in a system with a narrow repeated channel.

Process 800 is performed in a memory system that includes a memory circuit with a first and a second group of memory devices. The first group couples to a host via a first memory channel. The second group couples to the first group or a buffer of the first group via a second memory channel. The first memory channel has a first bandwidth for write data, which is more than a second bandwidth for write data for the second memory channel. The memory circuit includes a repeater that shares the host memory channel among the first and second groups of memory devices. The repeater provides up to half the full bandwidth to the second group of memory devices, and provides at least half the full bandwidth to the first group of memory devices.

During operation of an electronic device that includes the memory subsystem, a host generates requests to write data to memory devices, at 802. The host can include a host processor or a peripheral processor, a host operating system (OS) that controls the hardware and software platforms of the electronic device, or a process or program operating from an application or service under the host OS. In one embodiment, a memory controller or equivalent circuitry identifies the target memory module having the memory devices, and resolves any scheduling issues that might occur in writing to the second memory module over a narrow repeated channel, at 804. In one embodiment, the memory controller sends a command or sends write data to the buffer/repeater of the first memory module, at 806.

The repeater can perform write delivery or write repeating in one of multiple ways, determined at 808. In one embodiment, the repeater type is passthrough. In one embodiment, the repeater type is even/odd or identifier module selection. In one embodiment, the repeater type is speculative passthrough.

In passthrough, in one embodiment, the repeater receives the serialized command/write data on a bifurcated write channel from the memory controller/host, at 810. The repeater terminates half of the bifurcated channel at the first memory module, at 812. The repeater passes the other half of the memory channel through to the secondary memory module, at 816.

In module selection, in one embodiment, the repeater receives a command/write data packet, at 820. In one embodiment, the repeater determines which module is designated based on whether the packet is an even or odd packet. In one embodiment, the repeater determines which module is designated based on an identifier sent by the host, included with the packet. For example, the identifier can be a bit included in the first UI (unit interval). In one embodiment, the host applies a module selection bit in addition to even/odd routing. Based on the module designated for the packet, the repeater and/or the modules can operate differently on the packets. For example, in one embodiment, a system is designed to forward all even or odd packets to the secondary memory module, and not forward the other packets. In one embodiment, the system can further enable module selection with even and odd selection, which could enable more bandwidth to be provided to the primary memory module.

In one embodiment, the repeater internally routes or sends the command/write data to the primary memory module, and the repeater serializes and repeats the command/write data on the secondary channel for the secondary memory module, at 822. In one embodiment, each module determines if the packet is designated for the primary or first memory module or the second or secondary memory module, at 824. The memory modules can be configured to respond to their designated packets and ignore packets designated for the other memory module. In one embodiment, where even/odd selection is applied, the repeater repeats all of a certain type (e.g., even or odd) packets to the secondary memory module and also forwards the packets to the primary memory module. A select bit can identify the target module of the packet, and only the selected module will respond.

In speculative passthrough, in one embodiment, the repeater receives a command/write data packet, at 830. In one embodiment, the repeater automatically serializes and sends the first half of the packet to the secondary memory module, at 832. In one embodiment, the repeater determines if the packet is designated for the primary or secondary memory module, at 834. For example, the repeater can identify an identifier sent with the write packet. In one embodiment, the repeater internally routes or sends the command/write data to the primary memory module and does not passthrough the second half; instead the second half of the packet only goes to the primary memory module. In one embodiment, the repeater serializes and repeats the second half of the command/write data packet on the secondary channel, at 836.

Figure 9:
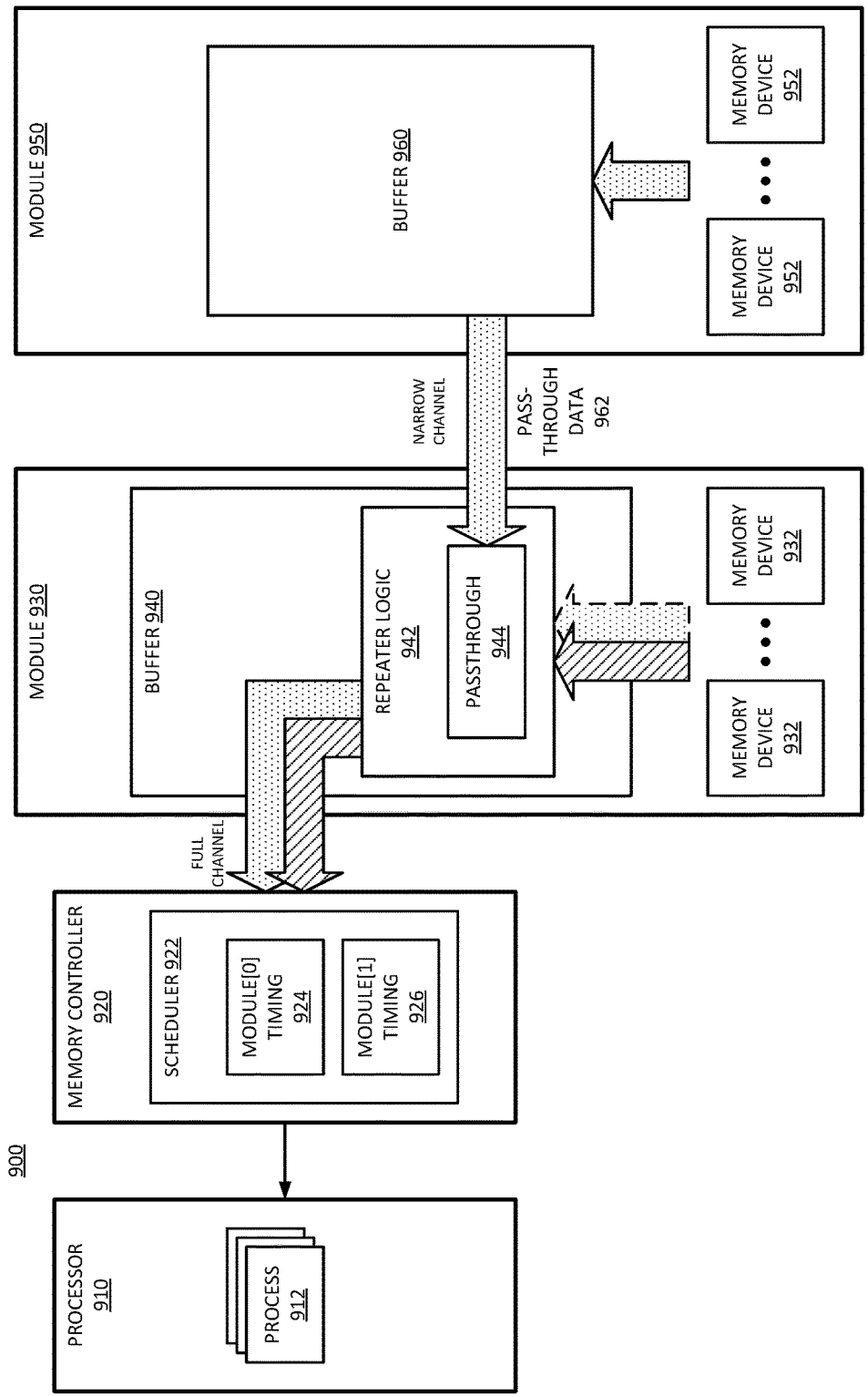
FIG. 9 is a block diagram of an embodiment of a system with a repeater channel architecture that implements read channel repeater passthrough.

FIG. 9 is a block diagram of an embodiment of a system with a repeater channel architecture that implements read channel repeater passthrough. System 900 represents elements of a memory subsystem in accordance with embodiments described herein. System 900 includes memory module 930, which represents a memory module that repeats a memory channel with reduced bandwidth, in accordance with an embodiment described herein, such as a memory module of system 100, a DDR module of system 200, or a primary module of system 300. System 900 includes memory module 950 coupled to the reduced bandwidth repeated channel.

System 900 includes processor 910, which includes hardware resources to execute processes 912. Processor 910 can include one or more processing devices, which can include multicore processors. Processes 912 represent agents, threads, routines, software programs, or other software executed on processor 910. Processes 912 generate requests for data stored in memory, to read and/or to write the data.

System 900 includes memory controller 920, which can be a standalone component or integrated as a controller circuit of processor 910. Memory controller 920 controls access to memory in response to the requests for data from processes 912. Memory controller 920 includes scheduler 922, which enables memory controller 920 to schedule the timing of requests to memory. In one embodiment, scheduler 922 includes module[0] timing 924 to manage the timing of read and/or write operations with module 930. In one embodiment, scheduler 922 includes module[1] timing 926 to manage the timing of read and/or write operations with module 950. It will be understood that the timing of read transactions from module 950 will have an inherent delay built in, due to the narrow repeated channel. In one embodiment, scheduler 922 schedules read and/or write operations between modules 930 and 950 based on timing parameters inherent in the system architecture, as well as based on timing characteristics resulting from the specific combination of read and write delivery techniques applied by buffer 940 for repeating the write channel.

System 900 includes at least two groups of memory devices, as represented by memory devices 932 of primary module 930 and memory devices 952 of secondary module 950. Scheduler 922 manages the ordering of commands to memory devices 932 and 952, such as read commands that will cause the respective modules 930 and 950 to return read data to memory controller 920. Management of the ordering of the commands enables memory controller 920 to schedule access between the two separate groups of memory devices. While illustrated as separate groups of memory devices, in one embodiment, similar techniques could be used to separately access two memory devices with point-to-point connections. In one embodiment, module 930 includes buffer 940, which represents a buffer and/or repeater in accordance with an embodiment of read channel bifurcation. Buffer 940 receives read data from module 950 to send to memory controller 920.

The connection from module 930 to memory controller 920 is labeled as a "full channel" link, and is illustrated as including two halves. The connection from module 950 to module 930 is labeled as a "narrow channel" link, and includes only one half of the full bandwidth. In one embodiment, the full channel is a full bandwidth unidirectional channel, and the narrow channel is a partial bandwidth unidirectional channel. Thus, the architecture of system 900 is in contrast to previous solutions that had full bandwidth secondary channels where the read data could be directly sent back to memory controller without needing to deserialize the read data. Deserialization will be understood as a reverse operation from serializing the data. Deserializing refers to sending data on more signal lines over fewer read cycles or UIs.

In one embodiment, buffer 940 includes repeater logic 942, which represents logic to enable buffer 940 to repeat read data over the full bandwidth channel. Repeater logic 942 enables buffer 940 to operate with a bifurcated read channel. Buffer 940 simply passes the read data through, but the data is deserialized by memory controller 920, which can treat the two read channel portions as independent channels, one from module 930 and one from module 950. Module 950 generates the read data, and transmits it via buffer 960 from memory devices 952.

In one embodiment, repeater logic 942 includes passthrough logic 944, which includes hardware logic to pass through read data. Passthrough logic 944 can be or include a register or buffer or latch that can receive the data and send it back out without processing, referring to reading, inspecting, or interpreting the data. It will be understood that memory controller 920 can deserialize the read data, to allow modules 930 and 950 to send read data on twice as many read cycles or UI for transmission of the data. Passthrough data 962 represents half of the data of the full bandwidth channel passed through from module 950 to module 930, and then to memory controller 920 without manipulation by buffer 940.

Consider a case where module 930 is plugged into system 900 and a connector to receive module 950 is open. In one embodiment in such a case, module 930 utilizes full read bandwidth, and the arrows representing both halves of the read channel can be generated as read data from memory devices 932. If module 950 is then plugged into system 900, in one embodiment, repeater logic 942 allocates half the bandwidth to module 930 and half to module 950. Such bandwidth can be dedicated to each module, without sharing between the modules.

In one embodiment, module 930, either via repeater logic 942 and/or via controls from memory controller 920, can adjust its operation to slow down read data generated by memory devices 932. Thus, module 930 can be made to have the same or substantially similar delay as module 950, which would normally have slower timing due to the longer channel length). In one embodiment, memory controller 920 internally handles all delays based on knowing the timing parameters. In one embodiment, the memory controller (in either the read or write case) can determine timing parameters, including delays, based on training or initialization of system 900.

Figure 10:
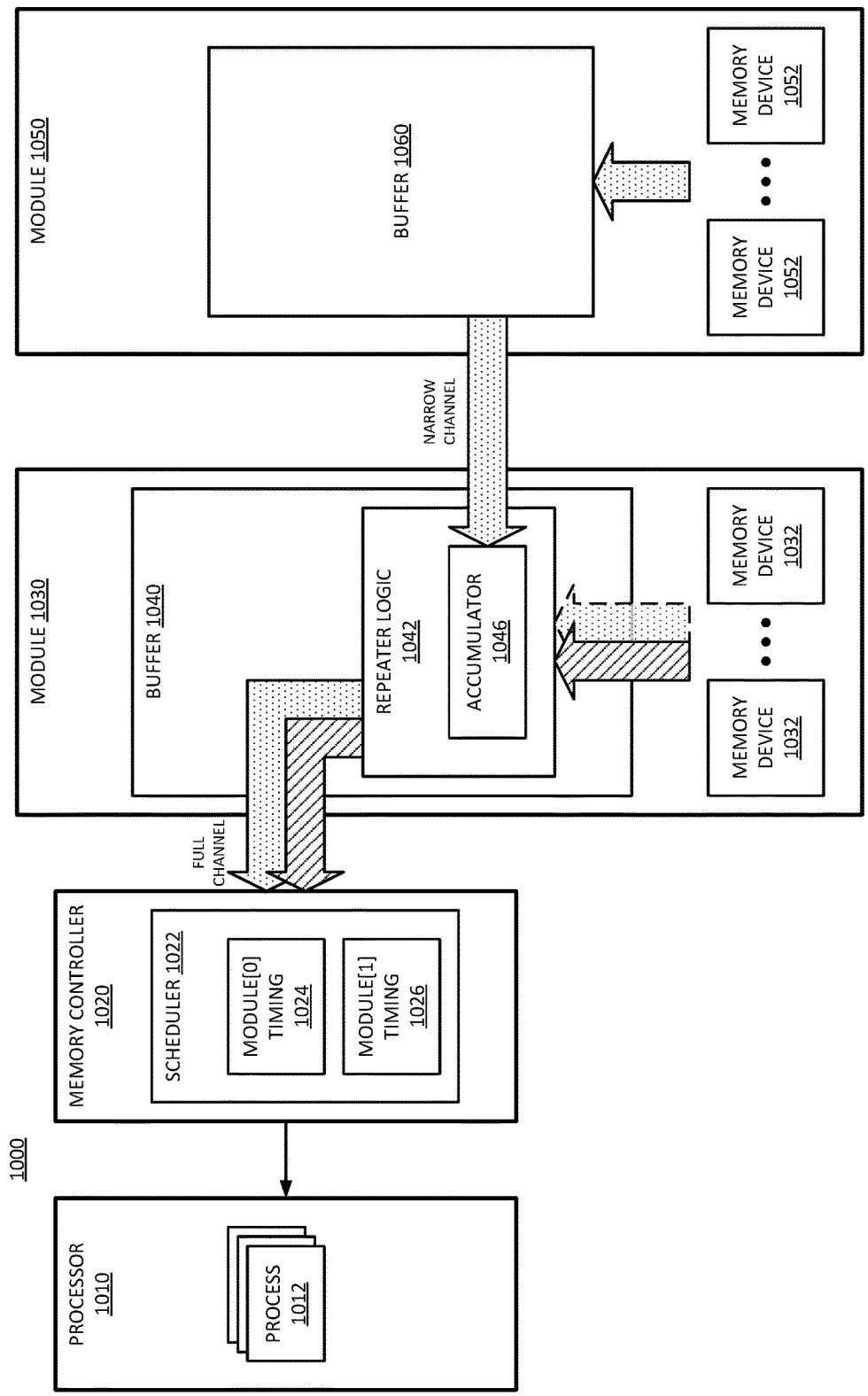
FIG. 10 is a block diagram of an embodiment of a system with a repeater channel architecture that implements read channel data accumulation at the repeater.

FIG. 10 is a block diagram of an embodiment of a system with a repeater channel architecture that implements read channel data accumulation at the repeater. System 1000 represents elements of a memory subsystem in accordance with embodiments described herein. System 1000 includes memory module 1030, which represents a memory module that repeats a memory channel with reduced bandwidth, in accordance with an embodiment described herein, such as a memory module of system 100, a DDR module of system 200, or a primary module of system 300. System 1000 includes memory module 1050 coupled to the reduced bandwidth repeated channel.

System 1000 includes processor 1010, which includes hardware resources to execute processes 1012. Processor 1010 can include one or more processing devices, which can include multicore processors. Processes 1012 represent agents, threads, routines, software programs, or other software executed on processor 1010. Processes 1012 generate requests for data stored in memory, to read and/or to write the data.

System 1000 includes memory controller 1020, which can be a standalone component or integrated as a controller circuit of processor 1010. Memory controller 1020 controls access to memory in response to the requests for data from processes 1012. Memory controller 1020 includes scheduler 1022, which enables memory controller 1020 to schedule the timing of requests to memory. In one embodiment, scheduler 1022 includes module[0] timing 1024 to manage the timing of read and/or write operations with module 1030. In one embodiment, scheduler 1022 includes module[1] timing 1026 to manage the timing of read and/or write operations with module 1050. It will be understood that the timing of read transactions from module 1050 will have an inherent delay built in, due to the narrow repeated channel. In one embodiment, scheduler 1022 schedules read and/or write operations between modules 1030 and 1050 based on timing parameters inherent in the system architecture, as well as based on timing characteristics resulting from the specific combination of read and write delivery techniques applied by buffer 1040 for repeating the write channel.

System 1000 includes at least two groups of memory devices, as represented by memory devices 1032 of primary module 1030 and memory devices 1052 of secondary module 1050. Scheduler 1022 manages the ordering of commands to memory devices 1032 and 1052, such as read commands that will cause the respective modules 1030 and 1050 to return read data to memory controller 1020. Management of the ordering of the commands enables memory controller 1020 to schedule access between the two separate groups of memory devices. While illustrated as separate groups of memory devices, in one embodiment, similar techniques could be used to separately access two memory devices with point-to-point connections. In one embodiment, module 1030 includes buffer 1040, which represents a buffer and/or repeater in accordance with an embodiment implementing read data accumulation. Buffer 1040 receives read data from module 1050 to send to memory controller 1020.

The connection from module 1030 to memory controller 1020 is labeled as a "full channel" link, and is illustrated as including two halves. The connection from module 1050 to module 1030 is labeled as a "narrow channel" link, and includes only one half of the full bandwidth. In one embodiment, the full channel is a full bandwidth unidirectional channel, and the narrow channel is a partial bandwidth unidirectional channel. Thus, the architecture of system 1000 is in contrast to previous solutions that had full bandwidth secondary channels where the read data could be directly sent back to memory controller without needing to deserialize the read data.

In one embodiment, buffer 1040 includes repeater logic 1042, which represents logic to enable buffer 1040 to repeat read data over the full bandwidth channel. In one embodiment, repeater logic 1042 includes accumulator 1046, which represents hardware logic to accumulate and deserialize read data from module 1050. Accumulator 1046 can be or include a register or buffer or latch that can receive the data and send it back out in a burst. For example, buffer 1060 can send data to accumulator 1046 over 2X UIs (unit intervals), which accumulator 1046 buffers, and then repeater logic 1042 deserializer the data to memory controller 1020 on more read signal lines than included in the repeated channel to send the data over X UIs.

In one embodiment, accumulator 1046 includes an accumulation threshold. The accumulation threshold can indicate how much data repeater logic 1042 should receive from buffer 1060 prior to beginning to send out a read data burst to the host. In one embodiment, accumulator 1046 accumulates the entire read data (e.g., threshold is all data) from module 1050 prior to sending a read burst to the host. It will be understood that such an implementation will introduce additional read delay. In one embodiment, accumulator 1046 accumulates half of the read data (e.g., threshold is half the data) from module 1050 prior to sending a read burst to the host. If repeater logic 1042 times the sending of the burst in accordance with accumulation of half the read data, the last bits of read data should be received from module 1050 just prior to the read cycle on which repeater logic 1042 should send them out to memory controller 1020. In one embodiment, accumulator 1046 accumulates one quarter of the read data (e.g., threshold is one quarter the data) from module 1050 prior to sending a read burst to the host. Such a threshold can be used in a critical chunk bypass implementation. If the critical chunk is important, in one embodiment, accumulator 1046 stores one quarter of a wordline/cacheline and then bursts out the first half of the read data line. In one embodiment, repeater logic 1042 will then wait until accumulator 1046 accumulates another quarter of the read data to burst out the second half.

In one embodiment, repeater logic 1042 provides access to module 1030 to the entire host read channel (e.g., the read channel connection between module 1030 and memory controller 1020, which is a full bandwidth channel) whenever module 1050 does not have read data to send to the host. In one embodiment, repeater logic 1042 accumulates and sends data from module 1050 when module 1050 has read data to send. In one embodiment, repeater logic 1042 limits the bandwidth of module 1050 to alternating read operations or alternating read packets, or only up to half the read bandwidth. Even if module 1050 is limited to alternating read operations, in one embodiment, repeater logic 1042 provides access to module 1030 to consecutive read operations, or at least half the read bandwidth.

Figure 11:
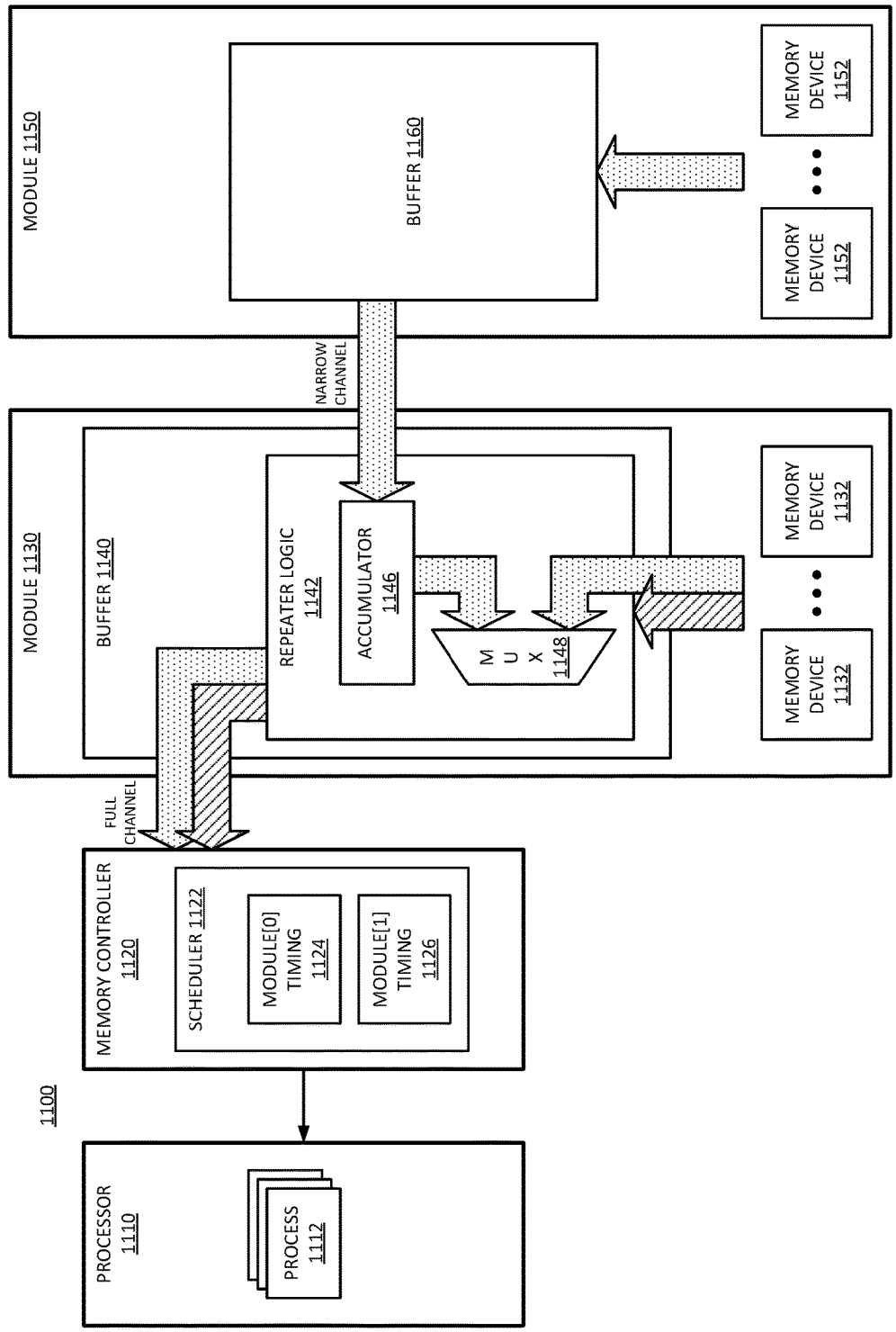
FIG. 11 is a block diagram of an embodiment of a system with a repeater channel architecture that implements read channel opportunistic primary module access.

FIG. 11 is a block diagram of an embodiment of a system with a repeater channel architecture that implements read channel opportunistic primary module access. System 1100 represents elements of a memory subsystem in accordance with embodiments described herein. System 1100 includes memory module 1130, which represents a memory module that repeats a memory channel with reduced bandwidth, in accordance with an embodiment described herein, such as a memory module of system 100, a DDR module of system 200, or a primary module of system 300. System 1100 includes memory module 1150 coupled to the reduced bandwidth repeated channel.

System 1100 includes processor 1110, which includes hardware resources to execute processes 1112. Processor 1110 can include one or more processing devices, which can include multicore processors. Processes 1112 represent agents, threads, routines, software programs, or other software executed on processor 1110. Processes 1112 generate requests for data stored in memory, to read and/or to write the data.

System 1100 includes memory controller 1120, which can be a standalone component or integrated as a controller circuit of processor 1110. Memory controller 1120 controls access to memory in response to the requests for data from processes 1112. Memory controller 1120 includes scheduler 1122, which enables memory controller 1120 to schedule the timing of requests to memory. In one embodiment, scheduler 1122 includes module[0] timing 1124 to manage the timing of read and/or write operations with module 1030. In one embodiment, scheduler 1122 includes module[1] timing 1126 to manage the timing of read and/or write operations with module 1150. It will be understood that the timing of read transactions from module 1150 will have an inherent delay built in, due to the narrow repeated channel. In one embodiment, scheduler 1122 schedules read and/or write operations between modules 1130 and 1150 based on timing parameters inherent in the system architecture, as well as based on timing characteristics resulting from the specific combination of read and write delivery techniques applied by buffer 1140 for repeating the write channel.

System 1100 includes at least two groups of memory devices, as represented by memory devices 1132 of primary module 1130 and memory devices 1152 of secondary module 1150. Scheduler 1122 manages the ordering of commands to memory devices 1132 and 1152, such as read commands that will cause the respective modules 1130 and 1150 to return read data to memory controller 1120. Management of the ordering of the commands enables memory controller 1120 to schedule access between the two separate groups of memory devices. While illustrated as separate groups of memory devices, in one embodiment, similar techniques could be used to separately access two memory devices with point-to-point connections. In one embodiment, module 1130 includes buffer 1140, which represents a buffer and/or repeater in accordance with an embodiment of opportunistic read delivery. Buffer 1140 receives read data from module 1150 to send to memory controller 1120.

The connection from module 1130 to memory controller 1120 is labeled as a "full channel" link, and is illustrated as including two halves. The connection from module 1150 to module 1130 is labeled as a "narrow channel" link, and includes only one half of the full bandwidth. In one embodiment, the full channel is a full bandwidth unidirectional channel, and the narrow channel is a partial bandwidth unidirectional channel. Thus, the architecture of system 1100 is in contrast to previous solutions that had full bandwidth secondary channels where the read data could be directly sent back to memory controller without needing to deserialize the read data.

In one embodiment, buffer 1140 includes repeater logic 1142, which represents logic to enable buffer 1140 to repeat read data over the full bandwidth channel. In one embodiment, repeater logic 1142 includes accumulator 1146, which represents hardware logic to accumulate and deserialize read data from module 1150. Accumulator 1146 can be or include a register or buffer or latch that can receive the data and send it back out in a burst. For example, buffer 1160 can send data to accumulator 1146 over 2X UIs (unit intervals), which accumulator 1146 buffers, and then repeater logic 1142 deserializer the data to memory controller 1120 on more read signal lines than included in the repeated channel to send the data over X UIs.

In one embodiment, accumulator 1146 operates the same as or similar to accumulator 1046 of system 1000. In one embodiment, repeater logic 1142 provides access to module 1130 to the entire host read channel (e.g., the read channel connection between module 1130 and memory controller 1120, which is a full bandwidth channel) whenever module 1150 does not have read data to send to the host. In one embodiment, repeater logic 1142 accumulates and sends data from module 1150 when module 1150 has read data to send. In one embodiment, repeater logic 1142 includes multiplexer or mux 1148 to select between data from buffer 1160 or data from memory devices 1132. In one embodiment, when module 1150 has no read data to send, repeater logic 1142 selects data from memory device 1132 via mux 1148. In one embodiment, when module 1150 has read data to send, repeater logic 1142 selects data from buffer 1160. Thus, in one embodiment, module 1130 can utilize both halves of the read channel.

In one embodiment, the opportunistic delivery mechanism can be considered to be a bifurcation of the read channel, where module 1150 has access only to half the read channel, and module 1130 has access to the other half of the read channel, as well as the first half if module 1150 has no read data to send. Thus, system 1100 can allocate specific portions of the read channel, via number of signal lines or via timing of signaling.

Figure 12:
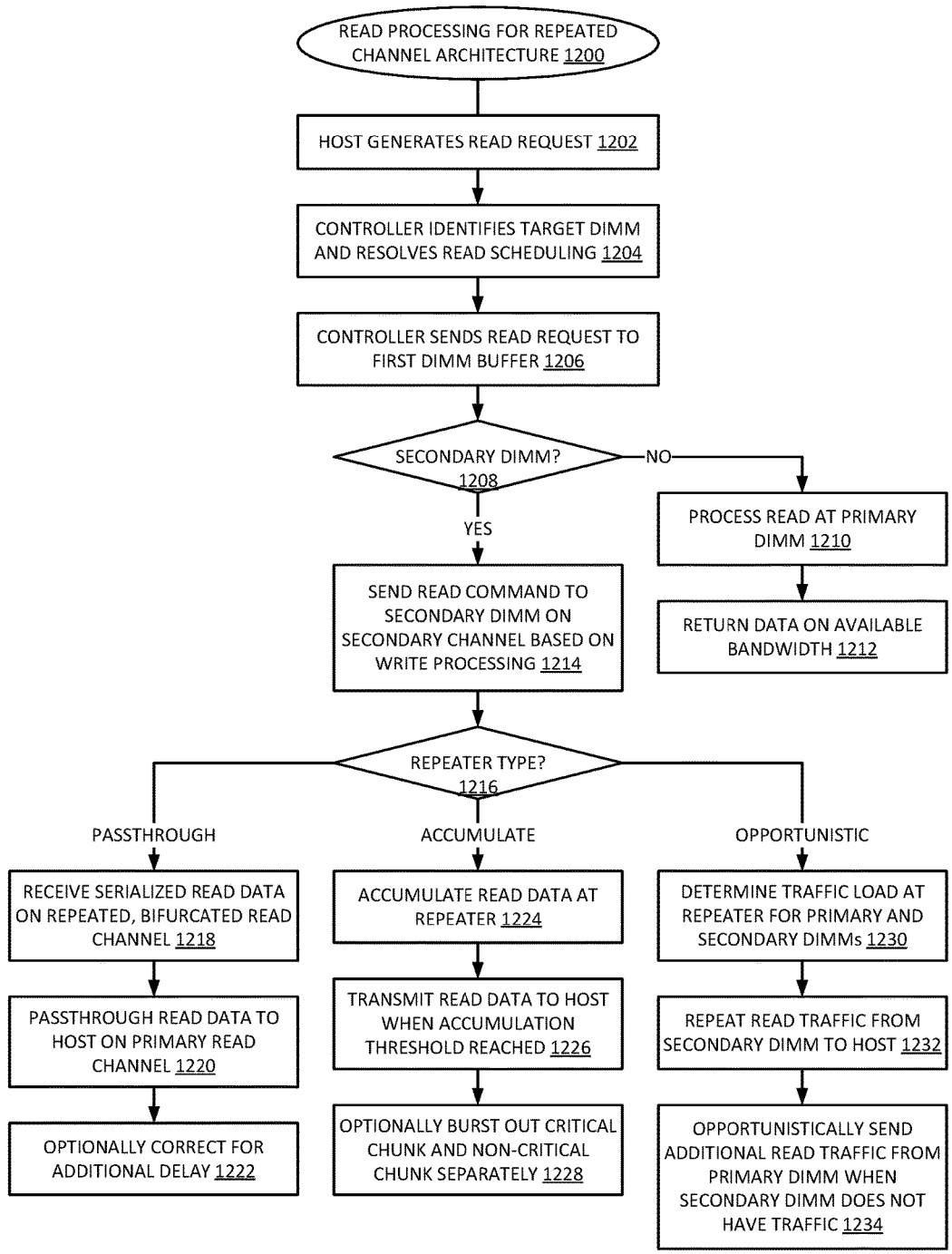
FIG. 12 is a flow diagram of an embodiment of a process for read processing in a repeated channel architecture with primary channel and secondary channel segments having different bandwidths.

FIG. 12 is a flow diagram of an embodiment of a process for read processing in a repeated channel architecture with primary channel and secondary channel segments having different bandwidths. Process 1200 illustrates a flow for read processing in a repeated channel architecture. Process 1200 provides one example of a flow in accordance with any embodiment of repeating read data from a secondary memory module to a host in a system with a narrow repeated channel.

Process 1200 is performed in a memory system that includes a memory circuit with a first and a second group of memory devices. The first group couples to a host via a first memory channel. The second group couples to the first group or a buffer of the first group via a second memory channel. The first memory channel has a first bandwidth for read data, which is more than a second bandwidth for read data for the second memory channel. The circuit includes a repeater that shares the host memory channel among the first and second groups of memory devices. The repeater provides up to half the full bandwidth to the second group of memory devices, and provides at least half the full bandwidth to the first group of memory devices.

During operation of an electronic device that includes the memory subsystem, a host generates requests to read data from memory devices, at 1202. In one embodiment, a memory controller identifies the target memory module having the memory devices, and resolves any scheduling issues that might occur in receiving read data, at 1204. In one embodiment, the memory controller sends a read request to the first memory module buffer, at 1206.

If the read request is not for the secondary memory module, at 1208 NO branch, the buffer sends the read request to the memory devices of the primary module, and the primary module processes the read request, at 1210. The primary module returns the data on available read channel bandwidth, at 1212. In one embodiment, the available read channel bandwidth for the primary module depends on the type of repeater implementation used. The available bandwidth is at least one half the total bandwidth, and can be up to one hundred percent of the bandwidth for a period of time. If the read request is for the secondary memory module, at 1208 YES branch, the repeater sends the read command to the secondary memory module on the secondary channel based on the write processing technique implemented, at 1214. The write processing is in accordance with process 800 of FIG. 8.

The repeater can perform read delivery in one of multiple ways, determined at 1216. In one embodiment, the repeater type is passthrough. In one embodiment, the repeater type is accumulation and burst operation. In one embodiment, the repeater type is opportunistic read data delivery.

In passthrough, in one embodiment, the repeater receives serialized read data on a bifurcated read channel from the secondary memory module, at 1218. The repeater passes through the read data to the host on the primary read channel, at 1220. In one embodiment, the repeater sends the data over only half the signal lines of the primary channel. In one embodiment, the buffer/repeater corrects for delay in reading from the secondary memory module by adjusting the timing of read from the primary memory module, at 1222. For example, the buffer can introduce delay into read data from the primary module to adjust the timing of the primary memory module to match the delay of reads from the secondary memory module.

In accumulate and burst operation, in one embodiment, the repeater receives and accumulates read data from the secondary memory module, at 1224. In one embodiment, the repeater transmits the read data to the host in response to reaching an accumulation threshold, at 1226. As mentioned above, the accumulation threshold can be, for example, half the read data from the secondary module, or one quarter the read data in the case of critical segment bypass. In one embodiment, the repeater bursts out the critical chunk of data separately from the non-critical chunk of data, at 1228. For example, the critical chunk can be sent as soon as it is accumulated, and then the repeater can allow the read data to accumulate until the non-critical data is received.

In opportunistic read opportunity, in one embodiment, the repeater determines a traffic load for the primary and secondary memory modules, at 1230. Determining the traffic load can include determining how much read traffic is expected from each, and what the timing of the read traffic will be. The repeater can repeat read traffic from the secondary DIMM to the host, at 1232. In one embodiment, the repeater opportunistically sends additional read traffic from the primary memory module when the secondary memory module does not have read traffic, at 1234.

It will be understood that the read operation, including the read delivery processing, is independent from the command/write data delivery processing. Thus, any type of read delivery processing can be used with any type of write delivery processing. Since read and write operations occur on unidirectional lines, read and write access can occur in parallel.

Figure 13:
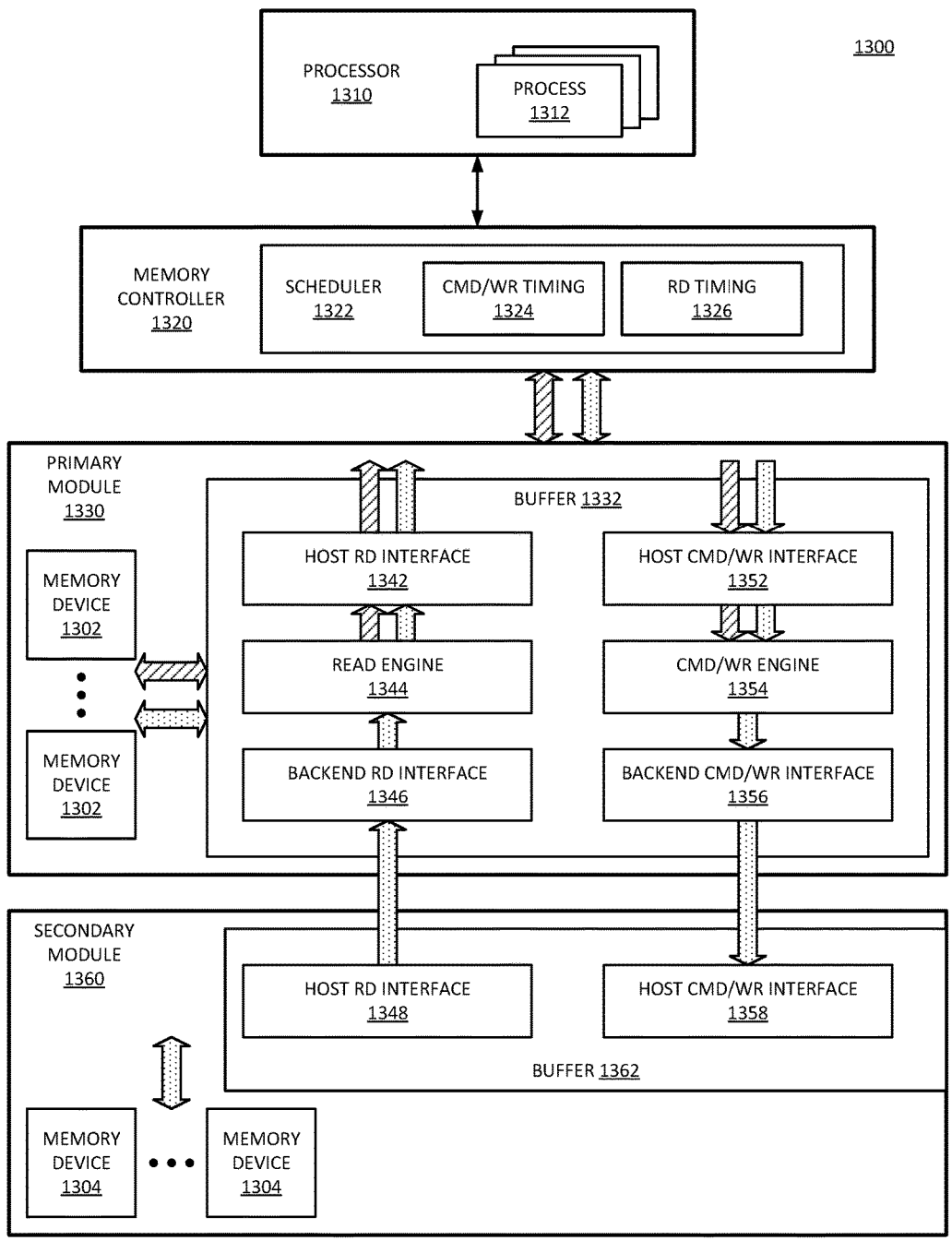
FIG. 13 is a block diagram of an embodiment of a system in which a memory controller schedules commands for a repeater channel architecture having primary and secondary channel segments of different bandwidth.

FIG. 13 is a block diagram of an embodiment of a system in which a memory controller schedules commands for a repeater channel architecture having primary and secondary channel segments of different bandwidth. System 1300 represents an example of an embodiment of a system in accordance with system 100 of FIG. 1. System 1300 includes processor 1310, which includes hardware resources to execute processes 1312. Processor 1310 can include one or more processing devices, which can include multicore processors. Processes 1312 represent agents, threads, routines, software programs, or other software executed on processor 1310. Processes 1312 generate requests for data stored in memory, to read and/or to write the data.

System 1300 includes memory controller 1320, which can be a stand alone component, which can also be referred to as a "standalone component," or integrated as a controller circuit of processor 1310. Memory controller 1320 controls access to memory in response to the requests for data from processes 1312. Memory controller 1320 includes scheduler 1322, which enables memory controller 1320 to schedule the timing of requests to memory. In one embodiment, scheduler 1322 includes command/write data timing 1324, which indicates timing information related to scheduling commands and write data on the write channel. In one embodiment, scheduler 1322 includes read timing 1326, which indicates timing information related to scheduling reads on the read channel. Scheduler 1322 can use command/write data timing 1324 and read timing 1326 to determine scheduling for combinations of read delivery and command/write delivery. For example, different write delivery mechanisms will result in different timing for data on the write channel. Additionally, different read delivery mechanisms will result in different timing for read data on the read channel. Based on the different timings, the memory controller will receive different read data at different times depending on how commands are delivered and how read data is returned. The memory controller needs to account for the different timings to ensure deterministic operations.

System 1300 includes at least two groups of memory devices, as represented by memory devices 1302 of primary module 1330 and memory devices 1304 of secondary module 1340. Scheduler 1322 manages the ordering of commands to memory devices 1302 and 1304 at least in part according to the timings identified above. Management of the ordering of the commands enables memory controller 1320 to schedule access between the two separate groups of memory devices. While illustrated as separate groups of memory devices, in one embodiment, similar techniques could be used to separately access two memory devices with point-to-point connections.

In one embodiment, primary module 1330 includes buffer 1332, which represents a buffer and/or repeater in accordance with embodiments described herein. Buffer 1332 receives commands and write data with host command/write (CMD/WR) interface 1352. The link to host command/write interface 1352 has an associated bandwidth that can be the bandwidth of a native memory channel connection. In one embodiment, secondary module 1360 includes buffer 1362, which represents a buffer that does not execute a repeat function. Buffer 1362 receives commands and write data from primary module 1330 with host command/write interface 1358, with a reduced bandwidth.

In one embodiment, buffer 1332 includes command/write engine 1354 to manage the repeat of the memory channel that enables a point-to-point connection to secondary module 1360. Buffer 1332 can repeat command and write data traffic from the host to secondary module 1360. Command/write engine 1354 can transfer commands and write data via backend command/write interface 1356, which is an interface to repeat the commands and data to secondary module 1360. Backend command/write interface 1356 can be referred to as a repeat interface. Backend command/write interface 1356 interfaces with host command/write interface 1358 of secondary module 1360. In one embodiment, host command/write interface 1358 is part of buffer 1362, but buffer 1362 of secondary module 1360 does not necessarily include a repeater in the buffer.

For read traffic, host read (RD) interface 1348 of secondary module 1360 enables the secondary module to send read data to memory controller 1320 and processor 1310. In one embodiment, host read interface 1348 is part of buffer 1362 at secondary module 1360. Host read interface 1348 interfaces with backend read (RD) interface 1346 of buffer 1332 of primary module 1330. In one embodiment, buffer 1332 includes read engine 1344 to manage the repeat of the memory channel that enables a point-to-point connection to secondary module 1360. Buffer 1332 can repeat read data traffic from secondary module 1360 to the host. Read engine 1344 can transfer read data via host read interface 1342, which is an interface to memory controller 1320 and processor 1310.

In one embodiment, memory controller 1320 via scheduler 1322 can be configured to schedule the data access to memory devices 1302 and to memory devices 1304 based on the management of traffic by read engine 1344 and command/write engine 1354. Thus, scheduler 1322 can schedule reads and writes to primary module 1330 and to secondary module 1360 based on expected timing to the memory devices, and available bandwidth to the modules. Read engine 1344 can operate to perform read delivery in accordance with any embodiment described herein, which can enable access to at least half, and up to all of the read channel bandwidth to primary module 1330, and to up to half the read channel bandwidth for secondary module 1340. Command/write engine 1354 can operate to perform command and write data delivery in accordance with any embodiment described herein, which can enable access to at least half, and up to all of the command/write channel bandwidth to primary module 1330, and to up to half the command/write channel bandwidth for secondary module 1340.

Figure 14:
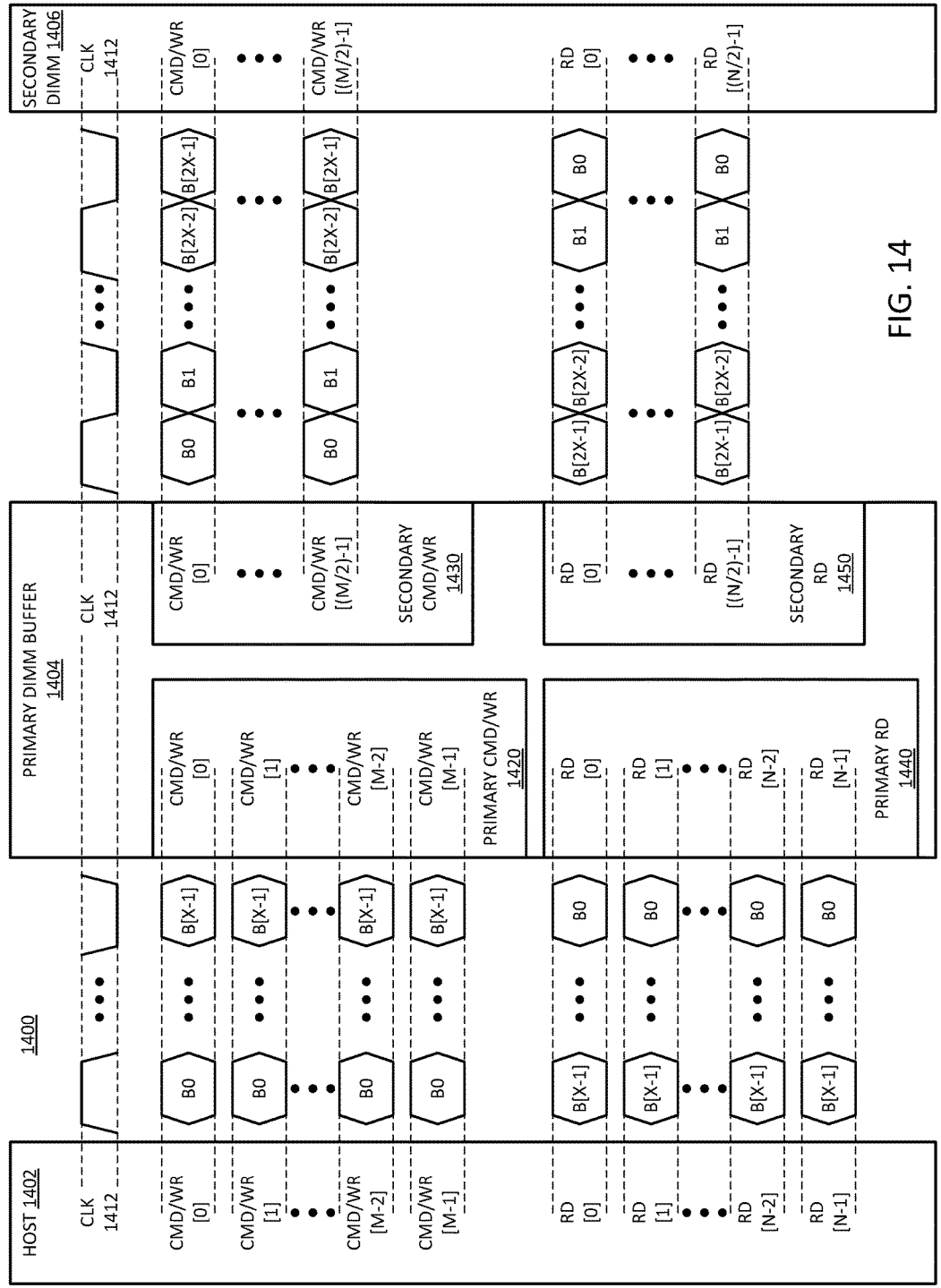
FIG. 14 is a block diagram of an embodiment of a system including a timing representation for a repeater channel architecture in which primary and secondary channel segments have different bandwidths.

FIG. 14 is a block diagram of an embodiment of a system including a timing representation for a repeater channel architecture in which primary and secondary channel segments have different bandwidths. System 1400 includes host 1402, primary DIMM buffer 1404, and secondary DIMM 1406. System 1400 includes a representation of timing between the host, the buffer, and the second DIMM. System 1400 provides one example of an embodiment of a system in accordance with system 100 of FIG. 1. System 1400 illustrates an embodiment of a repeated channel architecture as described herein. In the specific example of system 1400, the secondary or backend channel is repeated with half the bandwidth as the primary or front end channel, which can alternatively be referred to as a "frontend channel." To adjust for the reduced bandwidth, the secondary channel may double the amount of time it takes to exchange data from the secondary module to the primary module.

Host 1402 represents a host in accordance with any embodiment described herein, and includes at least logic to manage access to the memory. For example, host 1402 can include a host processor and a memory controller circuit. Primary DIMM buffer 1404 represents a buffer on a primary memory module, where the buffer provides a point-to-point connection to host 1402, and provides a point-to-point connection to a next connected memory module. Secondary DIMM 1406 represents the next connected memory module, which has a point-to-point connection to primary DIMM buffer 1404.

As illustrated, host 1402 generates clock 1412 to control the timing of signaling across the memory channel. Primary DIMM buffer 1404 repeats clock 1412 to secondary DIMM 1406. The memory devices (not specifically shown) time their operations based on clock 1412, on both the primary and the secondary memory modules.

In one embodiment, system 1400 includes separate read and write links. As illustrated, buffer 1404 includes primary command/write (CMD/WR) interface 1420 and primary read (RD) interface 1440, both of which interface with host 1402. Buffer 1404 repeats the primary command/write channel to secondary DIMM 1406 through secondary command/write interface 1430, and repeats the primary read channel to secondary DIMM 1406 through secondary read interface 1450.

In one embodiment, primary command/write interface 1420 includes M signal lines, and secondary command/write interface 1430 includes M/2 signal lines. In one embodiment, primary read interface 1440 includes N signal lines, and secondary read interface 1450 includes N/2 signal lines. In one embodiment, the primary channel includes M command/write data signal lines and N read data signal lines, managed as independent interfaces. Similarly, the secondary channel can include M/2 command/write data signal lines and N/2 read data signal lines, managed as separate interfaces.

As illustrated, the primary channel operates over X UIs (unit intervals), which can be referred to as a burst length (BL) for the memory access operation. For example, X can be 8 or 16 UIs to transfer a sequence of 8 or 16 bits, respectively, on each signal line. Thus, a memory access operation (either read or write) includes the transfer of a total number of bits equal to the interface size times the burst length. Thus, commands and writes transfer X*M bits from host 1402 to primary DIMM buffer 1404. If primary DIMM buffer 1404 repeats the bits to secondary DIMM 1406, the transfer occurs over half as many command/write data signal lines (M/2), but over a longer burst cycle (2X). Thus, the total number of bits transferred is the same: (2X)*(M/2)=X*M.

It will be understood that system 1400 illustrates the write bits as flowing from host 1402 towards the memory modules, while the read bits are illustrated as flowing from the memory modules to host 1402. Reads transfer X*N bits from primary DIMM buffer 1404 to host 1402. If a read access requests data bits from secondary DIMM 1406, the transfer includes the transfer of bits over N/2 read data signal lines for 2X UIs (unit intervals) for a total number of bits equal to (2X)*(N/2)=X*N. Primary DIMM buffer 1404 then repeats the X*N bits over N signal lines for X UIs to transfer the X*N bits to host 1402.

Figure 15:
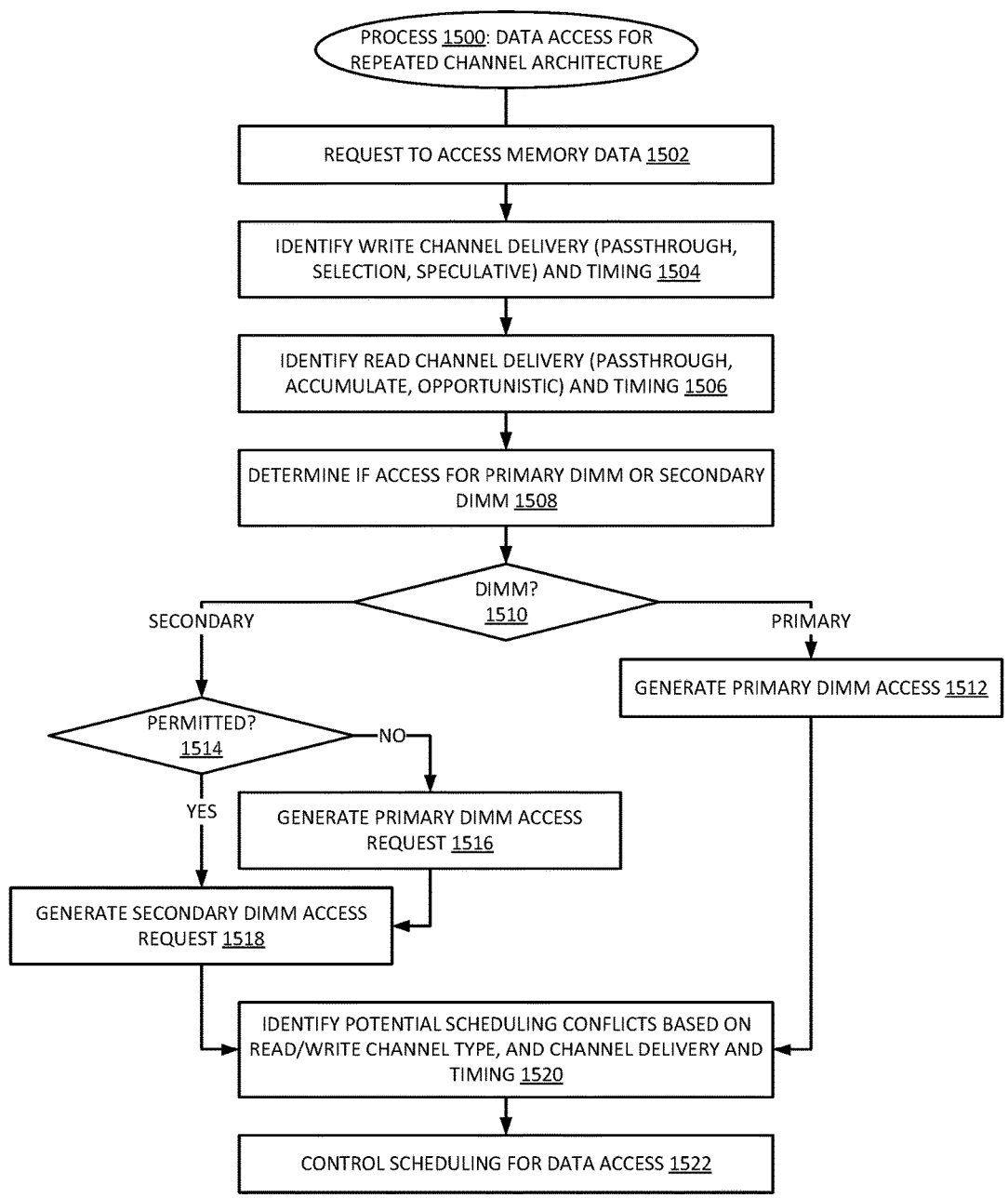
FIG. 15 is a flow diagram of an embodiment of a process for accessing data in a repeated channel architecture with primary channel and secondary channel segments having different bandwidths.

FIG. 15 is a flow diagram of an embodiment of a process for accessing data in a repeated channel architecture with primary channel and secondary channel segments having different bandwidths. Process 1500 illustrates one embodiment of a process for data access in a repeated channel architecture. Process 1500 can be implemented by any embodiment of a repeater or buffer on a primary module, in accordance with what is described herein.

In one embodiment, operation of the host software and/or hardware platform generates a request to access memory data, at 1502. The memory data refers to data stored in main memory, which is interfaced by the host through a repeated channel architecture, where the secondary or repeated channel between the memory modules has lower bandwidth than the primary channel that connects to the host.

In one embodiment, the memory controller identifies a write channel delivery mechanism (e.g., delivery mechanisms identified above as passthrough, selection, or speculative) and a read/write timing associated with the specific delivery type for the buffer on the primary DIMM, at 1504. In one embodiment, the memory controller identifies a read channel delivery mechanism (e.g., delivery mechanisms identified above as passthrough, accumulate and burst, or opportunistic) and read/write timing associated with the specific delivery mechanism type, at 1506.

In one embodiment, the memory controller determines if the access request is targeted for the primary DIMM or the secondary DIMM, at 1508. If the primary DIMM is targeted, at 1510 PRIMARY branch, in one embodiment, the memory controller generates access for the memory devices on the primary DIMM, at 1512. There may not be a need to repeat a command or write data if the access request is for the primary DIMM. If the access request is a read request, the memory devices of the primary DIMM can return the data in accordance with scheduling by the memory controller, as is described in more detail below with respect to 1520 and 1522.

In one embodiment, if the secondary DIMM is targeted, at 1510 SECONDARY branch, the memory controller determines if access is permitted to the secondary DIMM, at 1514. Access may not be permitted, depending on the scheduling of other requests in the memory system. If access is not permitted, 1514 NO branch, in one embodiment, the memory controller generates one or more accesses to the primary DIMM, at 1516. In one embodiment, the buffer can wait for the proper scheduling to access the secondary DIMM while primary DIMM access occurs. In one embodiment, after waiting an appropriate delay, the memory controller generates a secondary DIMM access request, at 1518.

In one embodiment, the memory controller will send the read and write access requests to the scheduler for scheduling and sending out to the DIMMs. In one embodiment, the memory controller, such as through the scheduler, can identify potential scheduling conflicts based on read/write channel type, and the channel delivery and timing, at 1520. In one embodiment, the memory controller controls scheduling for data access timing, at 1522, which can include reordering one or more access requests to address potential scheduling conflicts. Additionally or alternatively, the memory controller may introduce and/or control delay associated with a primary DIMM to match the timing of the secondary DIMM. In one embodiment, the memory controller sets internal timing parameters to compensate for the determined timing of receipt of data from the DIMMs.

Figure 16:
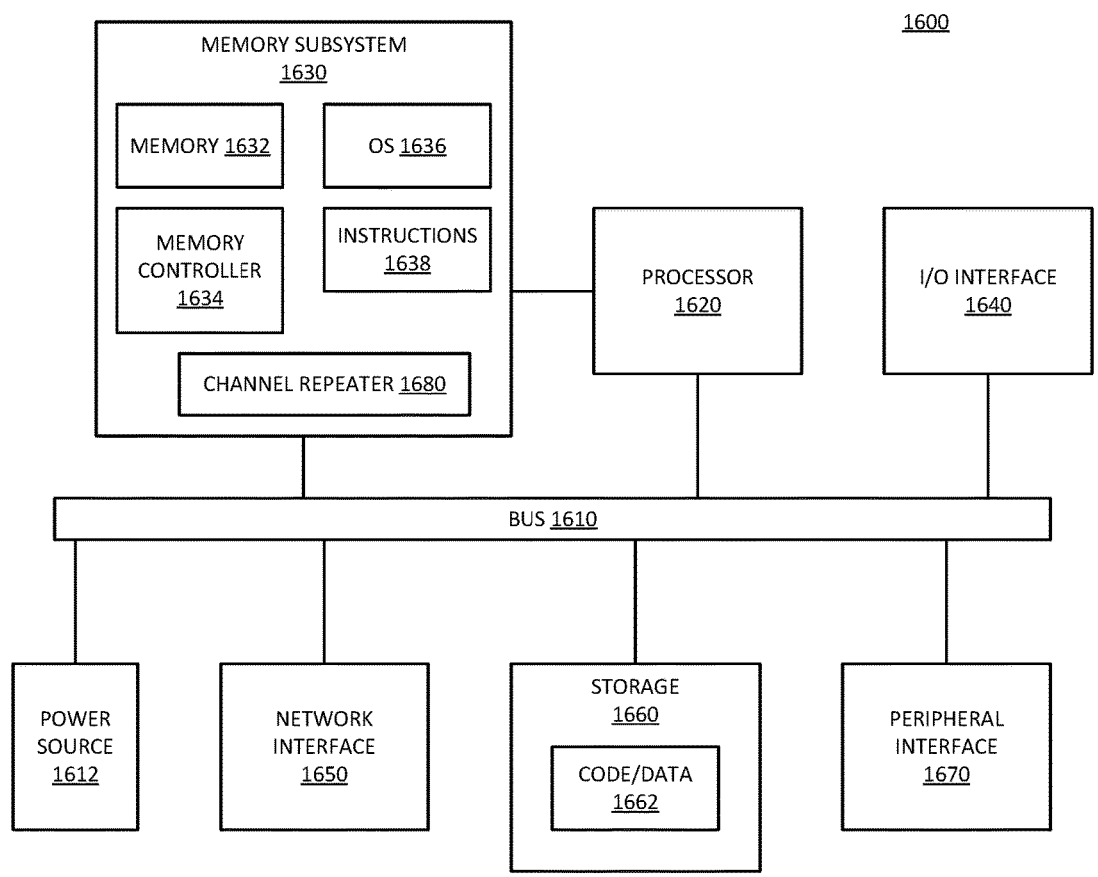
FIG. 16 is a block diagram of an embodiment of a computing system in which a repeated memory channel architecture can be implemented.

FIG. 16 is a block diagram of an embodiment of a computing system in which a repeated memory channel architecture can be implemented. System 1600 represents a computing device in accordance with any embodiment described herein, and can be a laptop computer, a desktop computer, a server, a gaming or entertainment control system, a scanner, copier, printer, routing or switching device, or other electronic device. System 1600 includes processor 1620, which provides processing, operation management, and execution of instructions for system 1600. Processor 1620 can include any type of microprocessor, central processing unit (CPU), processing core, or other processing hardware to provide processing for system 1600. Processor 1620 controls the overall operation of system 1600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices. Processor 1620 can execute data stored in memory 1632 and/or write or edit data stored in memory 1632.

Memory subsystem 1630 represents the main memory of system 1600, and provides temporary storage for code to be executed by processor 1620, or data values to be used in executing a routine. Memory subsystem 1630 can include one or more memory devices such as read-only memory (ROM), flash memory, one or more varieties of random access memory (RAM), or other memory devices, or a combination of such devices. Memory subsystem 1630 stores and hosts, among other things, operating system (OS) 1636 to provide a software platform for execution of instructions in system 1600. Additionally, other instructions 1638 are stored and executed from memory subsystem 1630 to provide the logic and the processing of system 1600. OS 1636 and instructions 1638 are executed by processor 1620. Memory subsystem 1630 includes memory device 1632 where it stores data, instructions, programs, or other items. In one embodiment, memory subsystem includes memory controller 1634, which is a memory controller to generate and issue commands to memory device 1632. It will be understood that memory controller 1634 could be a physical part of processor 1620.

Processor 1620 and memory subsystem 1630 are coupled to bus/bus system 1610. Bus 1610 is an abstraction that represents any one or more separate physical buses, communication lines/interfaces, and/or point-to-point connections, connected by appropriate bridges, adapters, and/or controllers. Therefore, bus 1610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus, commonly referred to as FIREWIRE. The buses of bus 1610 can also correspond to interfaces in network interface 1650.

Power source 1612 couples to bus 1610 to provide power to the components of system 1600. In one embodiment, power source 1612 includes an AC to DC (alternating current to direct current) adapter to plug into a wall outlet. Such AC power can be renewable energy (e.g., solar power). In one embodiment, power source 1612 includes only DC power, which can be provided by a DC power source, such as an external AC to DC converter. In one embodiment, power source 1612 includes wireless charging hardware to charge via proximity to a charging field. In one embodiment, power source 1612 can include an internal battery or fuel cell source.

System 1600 also includes one or more input/output (I/O) interface(s) 1640, network interface 1650, one or more internal mass storage device(s) 1660, and peripheral interface 1670 coupled to bus 1610. I/O interface 1640 can include one or more interface components through which a user interacts with system 1600 (e.g., video, audio, and/or alphanumeric interfacing). In one embodiment, I/O interface 1640 generates a display based on data stored in memory and/or operations executed by processor 1620. Network interface 1650 provides system 1600 the ability to communicate with remote devices (e.g., servers, other computing devices) over one or more networks. Network interface 1650 can include an Ethernet adapter, wireless interconnection components, USB (universal serial bus), or other wired or wireless standards-based or proprietary interfaces. Network interface 1650 can exchange data with a remote device, which can include sending data stored in memory and/or receive data to be stored in memory.

Storage 1660 can be or include any conventional medium for storing large amounts of data in a nonvolatile manner, such as one or more magnetic, solid state, or optical based disks, or a combination. Storage 1660 holds code or instructions and data 1662 in a persistent state (i.e., the value is retained despite interruption of power to system 1600). Storage 1660 can be generically considered to be a "memory," although memory 1630 is the executing or operating memory to provide instructions to processor 1620. Whereas storage 1660 is nonvolatile, memory 1630 can include volatile memory (i.e., the value or state of the data is indeterminate if power is interrupted to system 1600).

Peripheral interface 1670 can include any hardware interface not specifically mentioned above. Peripherals refer generally to devices that connect dependently to system 1600. A dependent connection is one where system 1600 provides the software and/or hardware platform on which operation executes, and with which a user interacts.

In one embodiment, system 1600 includes channel repeater 1680. Channel repeater 1680 can be implemented as a repeater and/or in a buffer on a primary memory module in accordance with any embodiment described herein. Channel repeater 1680 provides a point-to-point connection for a primary connection to a host from a primary memory module or a memory module physically coupled closest to the host on a memory channel. Channel repeater 1680 provides a secondary connection from the primary memory module to a secondary memory module, where the secondary connection has a lower bandwidth than the primary connection. In one embodiment, channel repeater 1680 can perform any command and write data delivery in accordance with what is described herein. In one embodiment, channel repeater 1680 can perform any read data delivery in accordance with what is described herein. In one embodiment, channel repeater can perform any combination of command and write data processing with any read processing, in accordance with what is described herein.

Figure 17:
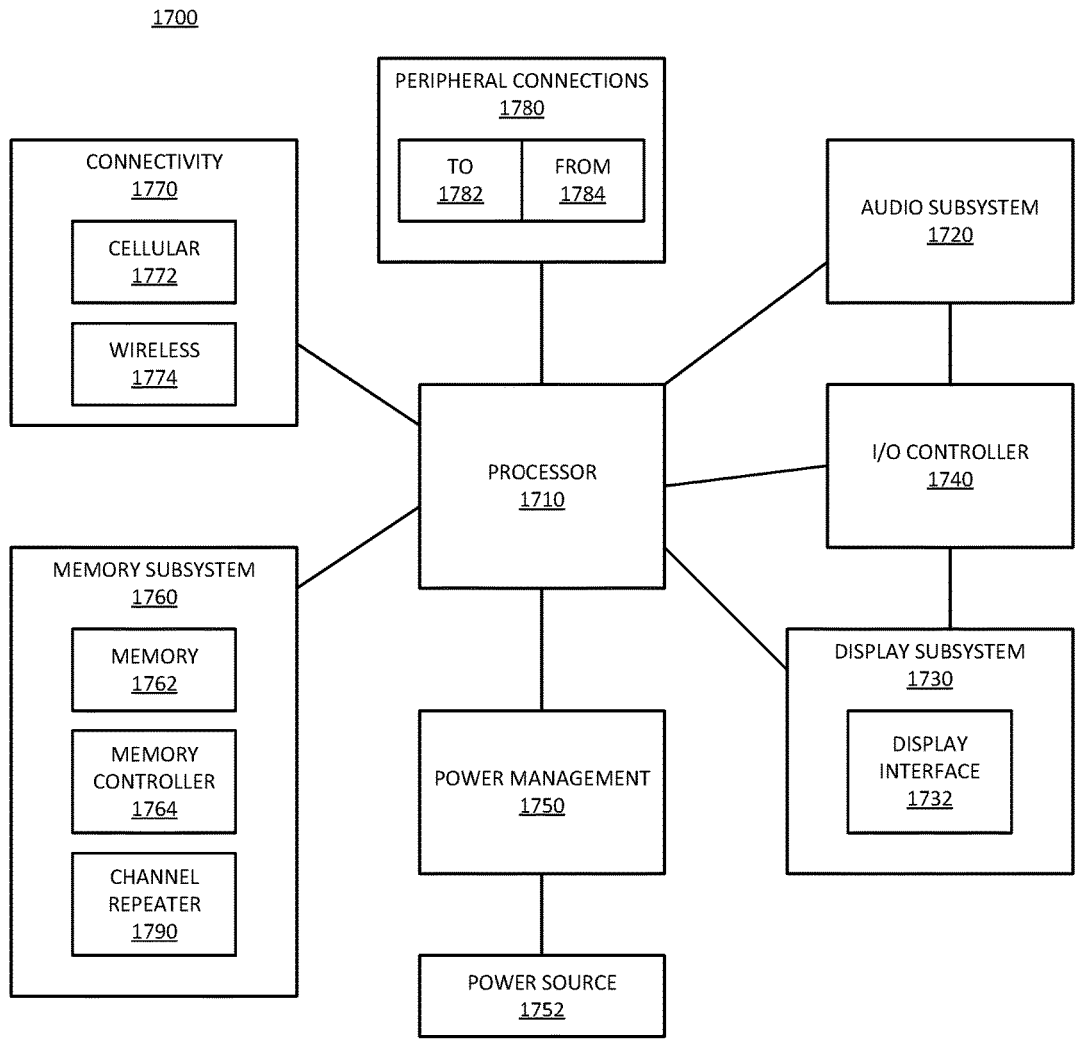
FIG. 17 is a block diagram of an embodiment of a mobile device in which a repeated memory channel architecture can be implemented.

FIG. 17 is a block diagram of an embodiment of a mobile device in which a repeated memory channel architecture can be implemented. Device 1700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 1700.

Device 1700 includes processor 1710, which performs the primary processing operations of device 1700. Processor 1710 can include one or more physical devices, such as microprocessors, application processors, microcontrollers, programmable logic devices, or other processing means. The processing operations performed by processor 1710 include the execution of an operating platform or operating system on which applications and/or device functions are executed. The processing operations include operations related to I/O (input/output) with a human user or with other devices, operations related to power management, and/or operations related to connecting device 1700 to another device. The processing operations can also include operations related to audio I/O and/or display I/O. Processor 1710 can execute data stored in memory and/or write or edit data stored in memory.

In one embodiment, device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1700, or connected to device 1700. In one embodiment, a user interacts with device 1700 by providing audio commands that are received and processed by processor 1710.

Display subsystem 1730 represents hardware (e.g., display devices) and software (e.g., drivers) components that provide a visual and/or tactile display for a user to interact with the computing device. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touchscreen device that provides both output to and input from a user. In one embodiment, display subsystem 1730 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem 1730 generates display information based on data stored in memory and/or operations executed by processor 1710.

I/O controller 1740 represents hardware devices and software components related to interaction with a user. I/O controller 1740 can operate to manage hardware that is part of audio subsystem 1720 and/or display subsystem 1730. Additionally, I/O controller 1740 illustrates a connection point for additional devices that connect to device 1700 through which a user might interact with the system. For example, devices that can be attached to device 1700 might include microphone devices, speaker or stereo systems, video systems or other display device, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of device 1700. Additionally, audio output can be provided instead of or in addition to display output. In another example, if display subsystem includes a touchscreen, the display device also acts as an input device, which can be at least partially managed by I/O controller 1740. There can also be additional buttons or switches on device 1700 to provide I/O functions managed by I/O controller 1740.

In one embodiment, I/O controller 1740 manages devices such as accelerometers, cameras, light sensors or other environmental sensors, gyroscopes, global positioning system (GPS), or other hardware that can be included in device 1700. The input can be part of direct user interaction, as well as providing environmental input to the system to influence its operations (such as filtering for noise, adjusting displays for brightness detection, applying a flash for a camera, or other features).

In one embodiment, device 1700 includes power management 1750 that manages battery power usage, charging of the battery, and features related to power saving operation. Power management 1750 manages power from power source 1752, which provides power to the components of system 1700. In one embodiment, power source 1752 includes an AC to DC (alternating current to direct current) adapter to plug into a wall outlet. Such AC power can be renewable energy (e.g., solar power, motion based power). In one embodiment, power source 1752 includes only DC power, which can be provided by a DC power source, such as an external AC to DC converter. In one embodiment, power source 1752 includes wireless charging hardware to charge via proximity to a charging field. In one embodiment, power source 1752 can include an internal battery or fuel cell source.

Memory subsystem 1760 includes memory device(s) 1762 for storing information in device 1700. Memory subsystem 1760 can include nonvolatile (state does not change if power to the memory device is interrupted) and/or volatile (state is indeterminate if power to the memory device is interrupted) memory devices. Memory 1760 can store application data, user data, music, photos, documents, or other data, as well as system data (whether long-term or temporary) related to the execution of the applications and functions of system 1700. In one embodiment, memory subsystem 1760 includes memory controller 1764 (which could also be considered part of the control of system 1700, and could potentially be considered part of processor 1710). Memory controller 1764 includes a scheduler to generate and issue commands to memory device 1762.

Connectivity 1770 includes hardware devices (e.g., wireless and/or wired connectors and communication hardware) and software components (e.g., drivers, protocol stacks) to enable device 1700 to communicate with external devices. The external devices could be separate devices, such as other computing devices, wireless access points or base stations, as well as peripherals such as headsets, printers, or other devices. In one embodiment, system 1700 exchanges data with an external device for storage in memory and/or for display on a display device. The exchanged data can include data to be stored in memory and/or data already stored in memory, to read, write, or edit data.

Connectivity 1770 can include multiple different types of connectivity. To generalize, device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1774 refers to wireless connectivity that is not cellular, and can include personal area networks (such as BLUETOOTH), local area networks (such as WiFi), and/or wide area networks (such as WiMax or WIMAX), or other wireless communication. Wireless communication refers to transfer of data through the use of modulated electromagnetic radiation through a non-solid medium. Wired communication occurs through a solid communication medium. All trademarks are the sole property of their owners, and are used herein solely for purposes of identification.

Peripheral connections 1780 include hardware interfaces and connectors, as well as software components (e.g., drivers, protocol stacks) to make peripheral connections. It will be understood that device 1700 could both be a peripheral device ("to" 1782) to other computing devices, as well as have peripheral devices ("from" 1784) connected to it. Device 1700 commonly has a "docking" connector to connect to other computing devices for purposes such as managing (e.g., downloading and/or uploading, changing, synchronizing) content on device 1700. Additionally, a docking connector can allow device 1700 to connect to certain peripherals that allow device 1700 to control content output, for example, to audiovisual or other systems.

In addition to a proprietary docking connector or other proprietary connection hardware, device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), FIREWIRE, or other type.

In one embodiment, system 1700 includes channel repeater 1790. Channel repeater 1790 can be implemented as a repeater and/or in a buffer on a primary memory module in accordance with any embodiment described herein. Channel repeater 1790 provides a point-to-point connection for a primary connection to a host from a primary memory module or a memory module physically coupled closest to the host on a memory channel. Channel repeater 1790 provides a secondary connection from the primary memory module to a secondary memory module, where the secondary connection has a lower bandwidth than the primary connection. In one embodiment, channel repeater 1790 can perform any command and write data delivery in accordance with what is described herein. In one embodiment, channel repeater 1790 can perform any read data delivery in accordance with what is described herein. In one embodiment, channel repeater can perform any combination of command and write data processing with any read processing, in accordance with what is described herein.

In one aspect, a memory circuit for write access to multiple memory devices coupled to a memory channel includes: a first group of memory devices coupled to a first memory channel, the first memory channel with a first bandwidth for commands from a host device; a second group of memory devices coupled to a second memory channel, the second memory channel coupled to the first memory channel and with a second bandwidth for commands from the host device, the second bandwidth a portion of the first bandwidth; and a repeater to couple the second memory channel to the first memory channel, the repeater to share the first bandwidth between the first and second groups of memory devices, wherein the repeater is to provide access to up to the portion of the first bandwidth for commands to the second group of memory devices, and to provide access to at least an amount equal to the first bandwidth less the portion for commands to the first group of memory devices.

In one embodiment, the bandwidth for commands further comprises bandwidth for commands or write data. In one embodiment, the portion comprises half. In one embodiment, the repeater is to share the first bandwidth between the first and second groups of memory devices, including to allocate half of write signal lines of the first memory channel to the first group of memory devices, and to allocate another half of write signal lines of the first memory channel to passthrough to the second memory channel. In one embodiment, the repeater is to dynamically allocate the half of the write signal lines to pass through to the second memory channel, wherein the repeater is to dynamically provide access to the first group of memory devices to both halves of the write signal lines when no commands are to be sent to the second group of memory devices. In one embodiment, the repeater is to share the first bandwidth between the first and second groups of memory devices, including to provide access to the second group of memory devices to only selected commands. In one embodiment, the repeater is to provide access to the second group of memory devices to only odd or even commands. In one embodiment, the repeater is to provide access to the first group of memory devices to both odd and even commands. In one embodiment, command packets include an identifier to identify either the first or second group of memory devices, and wherein the repeater is to route command packets to the first or second group of memory devices based on the identifier. In one embodiment, command packets include an identifier to identify either the first or second group of memory devices, and wherein the repeater is to route the first half of the received command packets to the first group of memory devices and automatically passthrough a first half of received command packets to the second group of memory devices, and subsequently selectively withhold a second half of received command packets from the second group of memory devices based on the identifier. In one embodiment, in accordance with a scheduling rule, the second group of memory devices does not receive consecutive commands. In one embodiment, the repeater is to provide command packets via direct passthrough to the second group of memory devices. In one embodiment, the repeater is to serialize commands from the host device to the second group of memory devices on the second memory channel. In one embodiment, the first group of memory devices comprises memory devices of a first memory module, and the second group of memory devices comprises memory devices of a second memory module. In one embodiment, the first memory module comprises a dual inline memory module (DIMM) including synchronous dynamic random access memory (SDRAM) devices compliant with a dual data rate version 5 (DDR5) standard, and the second memory module comprises a DIMM including SDRAM devices compliant with a dual data rate version 5 (DDR5) standard. In one embodiment, the first memory module comprises a dual inline memory module (DIMM) including synchronous dynamic random access memory (SDRAM) devices compliant with a dual data rate version 5 (DDR5) standard, and the second memory module comprises a DIMM including byte-addressable, random access nonvolatile memory devices. In one embodiment, the byte-addressable, random access nonvolatile memory devices comprise three dimensional memory devices including memory cells with chalcogenide glass.

In one aspect, a memory system for write access to multiple memory devices coupled to a memory channel includes: a memory controller circuit to control access to memory; a first memory module to couple to the memory controller circuit via a primary segment of a memory channel, the first memory module including multiple dynamic random access memory (DRAM) devices and a repeater, and the primary segment of the memory channel with a bandwidth for commands from the memory controller circuit; and a second memory module to couple to the memory controller circuit through the repeater via a secondary segment of the memory channel, the second memory module including multiple DRAM devices, and the secondary segment of the memory channel with a portion of the bandwidth for commands from the memory controller circuit, the portion less than the bandwidth; wherein the repeater is to provide access to up to the portion of the bandwidth for commands to the second memory module, and to provide access to at least an amount equal to the bandwidth less the portion for commands to the first memory module.

The memory system can include a memory circuit in accordance with any embodiment of the above aspect of a memory circuit. In one embodiment, the memory system further includes one or more of a multicore processor coupled to the memory controller, at least one core of the processor to execute data stored in the memory modules; a network adapter coupled to exchange data between the memory modules and a remote network location; a display communicatively coupled to the processor; and a battery to provide power to the memory system.

In one aspect, a method for write access to multiple memory devices coupled to a memory channel includes: receiving command signals at a repeater of a first group of memory devices from a host device on a first memory channel; and repeating the at least a portion of the command signals from the repeater to a second group of memory devices on a second memory channel, the first memory channel having a first bandwidth for commands from the host device, and the second memory channel having a second bandwidth for commands from the host device, the second bandwidth a portion of the first bandwidth; wherein the repeater is to provide access to up to the portion of the first bandwidth for commands to the second group of memory devices, and to provide access to at least an amount equal to the first bandwidth less the portion for commands to the first group of memory devices.

In one embodiment, the bandwidth for commands further comprises bandwidth for commands or write data. In one embodiment, the portion comprises half. In one embodiment, the repeater is to share the first bandwidth between the first and second groups of memory devices, including to allocate half of write signal lines of the first memory channel to the first group of memory devices, and to allocate another half of write signal lines of the first memory channel to passthrough to the second memory channel. In one embodiment, the repeater is to dynamically allocate the half of the write signal lines to pass through to the second memory channel, wherein the repeater is to dynamically provide access to the first group of memory devices to both halves of the write signal lines when no commands are to be sent to the second group of memory devices. In one embodiment, the repeater is to share the first bandwidth between the first and second groups of memory devices, including to provide access to the second group of memory devices to only selected commands. In one embodiment, the repeater is to provide access to the second group of memory devices to only odd or even commands. In one embodiment, the repeater is to provide access to the first group of memory devices to both odd and even commands. In one embodiment, command packets include an identifier to identify either the first or second group of memory devices, and wherein the repeater is to route command packets to the first or second group of memory devices based on the identifier. In one embodiment, command packets include an identifier to identify either the first or second group of memory devices, and wherein the repeater is to route the first half of the received command packets to the first group of memory devices and automatically passthrough a first half of received command packets to the second group of memory devices, and subsequently selectively withhold a second half of received command packets from the second group of memory devices based on the identifier. In one embodiment, in accordance with a scheduling rule, the second group of memory devices does not receive consecutive commands. In one embodiment, the repeater is to provide command packets via direct passthrough to the second group of memory devices. In one embodiment, the repeater is to serialize commands from the host device to the second group of memory devices on the second memory channel. In one embodiment, the first group of memory devices comprises memory devices of a first memory module, and the second group of memory devices comprises memory devices of a second memory module. In one embodiment, the first memory module comprises a dual inline memory module (DIMM) including synchronous dynamic random access memory (SDRAM) devices compliant with a dual data rate version 5 (DDR5) standard, and the second memory module comprises a DIMM including SDRAM devices compliant with a dual data rate version 5 (DDR5) standard. In one embodiment, the first memory module comprises a dual inline memory module (DIMM) including synchronous dynamic random access memory (SDRAM) devices compliant with a dual data rate version 5 (DDR5) standard, and the second memory module comprises a DIMM including byte-addressable, random access nonvolatile memory devices. In one embodiment, the byte-addressable, random access nonvolatile memory devices comprise three dimensional memory devices including memory cells with chalcogenide glass.

In one aspect, an article of manufacture comprises a computer readable storage medium having content stored thereon to cause execution of operations to execute a method for read access to multiple memory devices coupled to a memory channel in accordance with any embodiment of the above method. In one aspect, an apparatus for read access to multiple memory devices coupled to a memory channel, comprises hardware or software or a combination of hardware and software for performing operations to execute a method in accordance with any embodiment of the above method.

In one aspect, a memory circuit for read access to multiple memory devices coupled to a memory channel includes: a first group of memory devices coupled to a first memory channel, the first memory channel with a first bandwidth to send read data to a host device; a second group of memory devices coupled to a second memory channel, the second memory channel coupled to the first memory channel with a second bandwidth to send read data to the host device, the second bandwidth a portion of the first bandwidth; and a repeater to couple the second memory channel to the first memory channel, the repeater to share the first bandwidth between the first and second groups of memory devices, wherein the repeater is to provide access to up to the portion of the first bandwidth to send read data to the host, and to provide access to at least an amount equal to the first bandwidth less the portion to the first group of memory devices to send read data to the host.

In one embodiment, the portion comprises half. In one embodiment, the repeater is to share the first bandwidth between the first and second groups of memory devices, including to allocate half of read signal lines of the first memory channel to the first group of memory devices, and to allocate another half of read signal lines of the first memory channel to provide passthrough read data from the second memory channel to the host device. In one embodiment, the memory circuit further includes a multiplexer to select between a coupling of the other half of read signal lines of the first memory channel to the second memory channel, and a coupling of the other half of read signal lines of the first memory channel to the first group of memory devices. In one embodiment, the repeater is to share the first bandwidth between the first and second groups of memory devices, including to accumulate read data from the second group of memory devices with the second bandwidth, and burst the accumulated read data to the host device with the first bandwidth. In one embodiment, the repeater is to begin to burst the accumulated read data after accumulation of half of read data cycles for a read operation from the second group of memory devices. In one embodiment, the second group of memory devices is to first send a critical chunk of read data, and the repeater is to begin to burst the accumulated read data after accumulation of the critical chunk of read data. In one embodiment, the repeater is to share the first bandwidth between the first and second groups of memory devices, including to provide access to the first bandwidth to the first group of memory devices whenever the second group of memory devices has no read data to send to the host device, and to accumulate and burst read data from the second group of memory devices to the host device with the first bandwidth when the second group of memory devices has data to send to the host device. In one embodiment, the repeater is to limit access to the second group of memory devices to selected, non-consecutive read operations, and is to provide access to the first group of memory devices to consecutive read operations. In one embodiment, the first group of memory devices comprises memory devices of a first memory module, and the second group of memory devices comprises memory devices of a second memory module. In one embodiment, the first memory module comprises a dual inline memory module (DIMM) including synchronous dynamic random access memory (SDRAM) devices compliant with a dual data rate version 5 (DDR5) standard, and the second memory module comprises a DIMM including SDRAM devices compliant with a dual data rate version 5 (DDR5) standard. In one embodiment, the first memory module comprises a dual inline memory module (DIMM) including synchronous dynamic random access memory (SDRAM) devices compliant with a dual data rate version 5 (DDR5) standard, and the second memory module comprises a DIMM including byte-addressable, random access nonvolatile memory devices. In one embodiment, the byte-addressable, random access nonvolatile memory devices comprise three dimensional memory devices including memory cells with chalcogenide glass.

In one aspect, a memory system for read access to multiple memory devices coupled to a memory channel includes: a memory controller circuit to control access to memory; a first memory module to couple to the memory controller circuit via a primary segment of a memory channel, the first memory module including multiple dynamic random access memory (DRAM) devices and a repeater, and the primary segment of the memory channel with a bandwidth to send read data to the memory controller circuit; and a second memory module to couple to the memory controller circuit through the repeater via a secondary segment of the memory channel, the second memory module including multiple DRAM devices, and the secondary segment of the memory channel with a portion of the bandwidth to send read data to the memory controller circuit, the portion less than the bandwidth; wherein the repeater is to provide access to up to the portion of the bandwidth to the second memory module, and to provide access to at least an amount equal to the bandwidth less the portion to the first memory module.

The memory system can include a memory circuit in accordance with any embodiment of the above aspect of a memory circuit. In one embodiment, the memory system further includes one or more of a multicore processor coupled to the memory controller, at least one core of the processor to execute data stored in the memory modules; a network adapter coupled to exchange data between the memory modules and a remote network location; a display communicatively coupled to the processor; and a battery to provide power to the memory system.

In one aspect, a method for read access to multiple memory devices coupled to a memory channel includes: receiving read data at a repeater of a first group of memory devices from a second group of memory devices on a second memory channel coupled between the first group of memory devices and the second group of memory devices; and repeating at least a portion of the read data to a host device on a first memory channel coupled between the first group of memory devices and the host device, the first memory channel having a first bandwidth to send read data to the host device, and the second memory channel having a second bandwidth to send read data to the host device, the second bandwidth a portion of the first bandwidth; wherein the repeater is to provide access to up to the portion of the first bandwidth to send read data to the host, and to provide access to at least an amount equal to the first bandwidth less the portion to the first group of memory devices to send read data to the host.

In one embodiment, the portion comprises half. In one embodiment, repeating the read data comprises the repeater sharing the first bandwidth between the first and second groups of memory devices, including allocating half of read signal lines of the first memory channel to the first group of memory devices, and allocating another half of read signal lines of the first memory channel to provide passthrough read data from the second memory channel to the host device. In one embodiment, the method further includes selecting between coupling the other half of read signal lines of the first memory channel to the second memory channel, and coupling the other half of read signal lines of the first memory channel to the first group of memory devices. In one embodiment, repeating the read data comprises sharing the first bandwidth between the first and second groups of memory devices, including accumulating read data from the second group of memory devices with the second bandwidth, and bursting the accumulated read data to the host device with the first bandwidth. In one embodiment, the method further includes initiating the burst of accumulated read data after accumulation of half of read data cycles for a read operation from the second group of memory devices. In one embodiment, the second group of memory devices is to first send a critical chunk of read data, and further comprising initiating the burst of accumulated read data after accumulation of the critical chunk of read data. In one embodiment, repeating the read data comprises sharing the first bandwidth between the first and second groups of memory devices, including providing access to the first bandwidth to the first group of memory devices whenever the second group of memory devices has no read data to send to the host device, and accumulating and bursting read data from the second group of memory devices to the host device with the first bandwidth when the second group of memory devices has data to send to the host device. In one embodiment, repeating the read data further comprises limiting access to the second group of memory devices to selected, non-consecutive read operations, and providing access to the first group of memory devices to consecutive read operations. In one embodiment, the first group of memory devices comprises memory devices of a first memory module, and the second group of memory devices comprises memory devices of a second memory module. In one embodiment, the first memory module comprises a dual inline memory module (DIMM) including synchronous dynamic random access memory (SDRAM) devices compliant with a dual data rate version 5 (DDR5) standard, and the second memory module comprises a DIMM including SDRAM devices compliant with a dual data rate version 5 (DDR5) standard. In one embodiment, the first memory module comprises a dual inline memory module (DIMM) including synchronous dynamic random access memory (SDRAM) devices compliant with a dual data rate version 5 (DDR5) standard, and the second memory module comprises a DIMM including byte-addressable, random access nonvolatile memory devices. In one embodiment, the byte-addressable, random access nonvolatile memory devices comprise three dimensional memory devices including memory cells with chalcogenide glass.

In one aspect, an article of manufacture comprises a computer readable storage medium having content stored thereon to cause execution of operations to execute a method for read access to multiple memory devices coupled to a memory channel in accordance with any embodiment of the above method. In one aspect, an apparatus for read access to multiple memory devices coupled to a memory channel, comprises hardware or software or a combination of hardware and software for performing operations to execute a method in accordance with any embodiment of the above method.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a hardware means or a software means, or a combination of hardware and software, through which the operations or functions described are performed. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory circuit, comprising:
    a first group of memory devices coupled to a first memory channel, the first memory channel having a first bandwidth to send read data to a host device;
    a second group of memory devices coupled to a second memory channel, the second memory channel coupled to the first memory channel and having a second bandwidth to send read data to the host device, the second bandwidth a portion of the first bandwidth; and
    a repeater to couple the second memory channel to the first memory channel, the repeater to share the first bandwidth between the first and second groups of memory devices, wherein the repeater is configured to provide access to up to the portion of the first bandwidth to the second group of memory devices to send read data to the host device, and to provide access to the first group of memory devices to either the first bandwidth or to the first bandwidth less the portion to send read data to the host device when the first group of memory devices and the second group of memory devices are coupled, respectively, to the first and second memory channels.

2. The memory circuit of claim 1, wherein the portion comprises half of the first bandwidth.

3. The memory circuit of claim 2, wherein the repeater is to allocate half of read signal lines of the first memory channel to the first group of memory devices, and to allocate the other half of read signal lines of the first memory channel to passthrough read data from the second memory channel to the host device.

4. The memory circuit of claim 3, further comprising a multiplexer to select between a coupling of the other half of read signal lines of the first memory channel to the second memory channel, and a coupling of the other half of read signal lines of the first memory channel to the first group of memory devices.

5. The memory circuit of claim 1, wherein the repeater is to accumulate read data from the second group of memory devices with the second bandwidth, and burst the accumulated read data to the host device with the first bandwidth.

6. The memory circuit of claim 5, wherein the repeater is to begin to burst the accumulated read data after accumulation of data for half of read data cycles for a read operation from the second group of memory devices.

7. The memory circuit of claim 5, wherein the second group of memory devices is to first send a critical chunk of read data, and the repeater is to begin to burst the accumulated read data after accumulation of the critical chunk of read data.

8. The memory circuit of claim 1, wherein the repeater is to provide access to the first bandwidth to the first group of memory devices whenever the second group of memory devices has no read data to send to the host device, and to accumulate and burst read data from the second group of memory devices to the host device with the first bandwidth when the second group of memory devices has data to send to the host device.

9. The memory circuit of claim 8, wherein the repeater is configured to limit access to the second group of memory devices to selected, non-consecutive read operations, and to provide access to the first group of memory devices to consecutive read operations.

10. The memory circuit of claim 1, wherein the first group of memory devices comprises memory devices of a first memory module, and the second group of memory devices comprises memory devices of a second memory module.

11. The memory circuit of claim 10, wherein the first memory module comprises a dual inline memory module (DIMM) including synchronous dynamic random access memory (SDRAM) devices compliant with a dual data rate version 5 (DDR5) standard, and the second memory module comprises a DIMM including SDRAM devices compliant with a dual data rate version 5 (DDR5) standard.

12. The memory circuit of claim 10, wherein the first memory module comprises a dual inline memory module (DIMM) including synchronous dynamic random access memory (SDRAM) devices compliant with a dual data rate version 5 (DDR5) standard, and the second memory module comprises a DIMM including byte-addressable, random access nonvolatile memory devices.

13. The memory circuit of claim 12, wherein the byte-addressable, random access nonvolatile memory devices comprise three dimensional memory devices including memory cells with chalcogenide glass.

14. A memory system, comprising:
a memory controller circuit to control access to memory;
a first memory module coupled to the memory controller circuit via a primary segment of a memory channel, the first memory module including multiple dynamic random access memory (DRAM) devices and a repeater, and the primary segment of the memory channel having a bandwidth to send read data to the memory controller circuit; and
a second memory module coupled to the memory controller circuit through the repeater via a secondary segment of the memory channel, the second memory module including multiple DRAM devices, and the secondary segment of the memory channel having only a portion of the bandwidth to send read data to the memory controller circuit, the portion being less than the bandwidth;
wherein the repeater is configured to provide access to up to the portion of the bandwidth to the second memory module when the second memory module is coupled to the memory controller circuit, and to provide access to the first memory module to either an amount equal to the bandwidth less the portion, or an amount equal to the bandwidth, when the first memory module and the second memory module are coupled to the memory controller circuit.

15. The memory system of claim 14, wherein the portion comprises half of the bandwidth.

16. The memory system of claim 15, wherein the repeater is to share the bandwidth between the first and second memory modules, including to allocate half of read signal lines of the primary segment to the first memory module, and to allocate another half of read signal lines of the primary segment to passthrough read data from the secondary segment of the memory channel to the memory controller circuit.

17. The memory system of claim 16, further comprising a multiplexer to select between a coupling of the other half of read signal lines of the primary segment to the secondary segment of the memory channel, and a coupling of the other half of read signal lines of the primary segment to the first memory module.

18. The memory system of claim 15, wherein the repeater is to accumulate read data from the second memory module with the portion of the bandwidth, and burst the accumulated read data to the memory controller circuit with the bandwidth.

19. The memory system of claim 18, wherein the repeater is to begin to burst the accumulated read data after accumulation of data for half of read data cycles for a read operation from the second memory module.

20. The memory system of claim 18, wherein the second memory module is to first send a critical chunk of read data, and the repeater is to begin to burst the accumulated read data after accumulation of the critical chunk of read data.

21. The memory system of claim 14, wherein the repeater is to provide access to the bandwidth to the first memory module whenever the second memory module has no read data to send to the memory controller circuit, and to accumulate and burst read data from the second memory module to the memory controller circuit with the bandwidth when the second memory module has data to send to the memory controller circuit.

22. The memory system of claim 21, wherein the repeater is configured to limit access to the second memory module to selected non-consecutive read operations, and to provide access to the first memory module to consecutive read operations.

23. The memory system of claim 14, wherein the memory channel comprises a first memory channel, and further comprising a second memory channel;
  wherein the first memory module is coupled to the memory controller circuit via a primary segment of the first memory channel and via a primary segment of the second memory channel, and the second memory module is coupled to a secondary segment of the first memory channel and to a secondary segment of the second memory channel.

24. The memory system of claim 14, wherein the first memory module comprises a dual inline memory module (DIMM) including synchronous dynamic random access memory (SDRAM) devices compliant with a dual data rate version 5 (DDR5) standard, and the second memory module comprises a DIMM including SDRAM devices compliant with a dual data rate version 5 (DDR5) standard.

25. The memory system of claim 14, wherein the first memory module comprises a dual inline memory module (DIMM) including synchronous dynamic random access memory (SDRAM) devices compliant with a dual data rate version 5 (DDR5) standard, and the second memory module comprises a DIMM including byte-addressable, random access nonvolatile memory devices.

26. The memory system of claim 14, further comprising one or more of
  a multicore processor coupled to the memory controller circuit, at least one core of the multicore processor to execute data stored in the first and second memory modules;
  a network adapter coupled to exchange data between the first and second memory modules and a remote network location;
  a display communicatively coupled to a processor; and
  a battery to provide power to the memory system.

* * * * *